US009685391B2

(12) United States Patent
 Kobayashi

(10) Patent No.: US 9,685,391 B2
(45) Date of Patent: Jun. 20, 2017

(54) WIRING BOARD AND SEMICONDUCTOR PACKAGE

(71) Applicant: SHINKO ELECTRIC INDUSTRIES CO., LTD., Nagano (JP)

(72) Inventor: Kazutaka Kobayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/090,791

(22) Filed: Apr. 5, 2016

(65) Prior Publication Data
 US 2016/0307814 A1    Oct. 20, 2016

(30) Foreign Application Priority Data
 Apr. 17, 2015 (JP) ................. 2015-085102

(51) Int. Cl.
 *H01L 23/18* (2006.01)
 *H01L 23/367* (2006.01)
 (Continued)

(52) U.S. Cl.
 CPC ............ *H01L 23/367* (2013.01); *H01L 23/13* (2013.01); *H01L 23/49827* (2013.01); *H01L 23/49838* (2013.01); *H01L 23/296* (2013.01); *H01L 23/3121* (2013.01); *H01L 23/42* (2013.01); *H01L 23/49894* (2013.01); *H01L 24/16* (2013.01); *H01L 24/32* (2013.01); *H01L 24/48* (2013.01); *H01L 24/73* (2013.01); *H01L 2224/16227* (2013.01); *H01L 2224/32225* (2013.01); *H01L 2224/48091* (2013.01); *H01L 2224/48137* (2013.01);
 (Continued)

(58) Field of Classification Search
 CPC . H01L 23/18; H01L 23/498; H01L 23/49827; H01L 23/49838; H01L 23/367; H01L 23/49894
 See application file for complete search history.

(56) References Cited

U.S. PATENT DOCUMENTS 6,359,341 B1 * 3/2002 Huang .................... H01L 23/13
                                                    257/700
6,657,296 B2 * 12/2003 Ho ....................... H01L 23/3128
                                                    257/706
(Continued)

FOREIGN PATENT DOCUMENTS

JP          2010-062199         3/2010

*Primary Examiner* — Peniel M Gumedzoe
(74) *Attorney, Agent, or Firm* — IPUSA, PLLC

(57) ABSTRACT

A wiring board includes a substrate having first and second opposite surfaces, a first adhesive layer on the first surface of the substrate, a thermal diffusion metal pattern on the first adhesive layer, multiple vias vertically extending from the thermal diffusion metal pattern into the substrate through the first adhesive layer with a gap around each of the vias in the substrate and the first adhesive layer, and a second adhesive layer on the second surface of the substrate. The thermal diffusion metal pattern is not to be electrically connected to a semiconductor device to be mounted. The second adhesive layer fills in the gap around each of the vias within the substrate and the first adhesive layer. The gap includes a first gap and a second gap in the substrate and the first adhesive layer, respectively. The second gap is greater in lateral size than the first gap.

18 Claims, 17 Drawing Sheets

(51) Int. Cl.
  *H01L 23/498* (2006.01)
  *H01L 23/13* (2006.01)
  *H01L 23/29* (2006.01)
  *H01L 23/31* (2006.01)
  *H01L 23/42* (2006.01)
  *H01L 23/00* (2006.01)

(52) U.S. Cl.
  CPC ............... *H01L 2224/48227* (2013.01); *H01L 2224/48235* (2013.01); *H01L 2224/73204* (2013.01); *H01L 2224/73265* (2013.01); *H01L 2924/00014* (2013.01); *H01L 2924/13055* (2013.01); *H01L 2924/13091* (2013.01); *H01L 2924/1531* (2013.01)

(56) References Cited

U.S. PATENT DOCUMENTS

2003/0136577 A1* 7/2003 Abe ...................... H01L 23/142
  174/255
2009/0115050 A1* 5/2009 Kasuya ............... H01L 23/3677
  257/701

\* cited by examiner

WIRING BOARD AND SEMICONDUCTOR PACKAGE

CROSS-REFERENCE TO RELATED APPLICATION

This application is based upon and claims the benefit of priority of the prior Japanese Patent Application No. 2015-085102, filed on Apr. 17, 2015, the entire contents of which are incorporated herein by reference.

FIELD

A certain aspect of the embodiments discussed herein is related to wiring boards and semiconductor packages.

BACKGROUND

In recent years, a wiring board for mounting a heat-releasing component that releases heat due to an operating-time electric current has been proposed. According to such a wiring board, for example, a copper post for dissipating the heat of a heat-releasing element is formed in the thickness direction of the wiring board. The copper post is continuous with a copper-plated wiring pattern through a copper-plated blind via. The heat-releasing component is attached to the wiring pattern through copper paste. (See, for example, Japanese Laid-Open Patent Application No. 2010-62199.)

SUMMARY

According to an aspect of the present invention, a wiring board includes a substrate having first and second opposite surfaces, a first adhesive layer on the first surface of the substrate, a thermal diffusion metal pattern on the first adhesive layer, multiple vias vertically extending from the thermal diffusion metal pattern into the substrate through the first adhesive layer with a gap around each of the vias in the substrate and the first adhesive layer, and a second adhesive layer on the second surface of the substrate. The thermal diffusion metal pattern is not to be electrically connected to a semiconductor device to be mounted. The second adhesive layer fills in the gap around each of the vias within the substrate and the first adhesive layer. The gap includes a first gap and a second gap in the substrate and the first adhesive layer, respectively. The second gap is greater in lateral size than the first gap.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
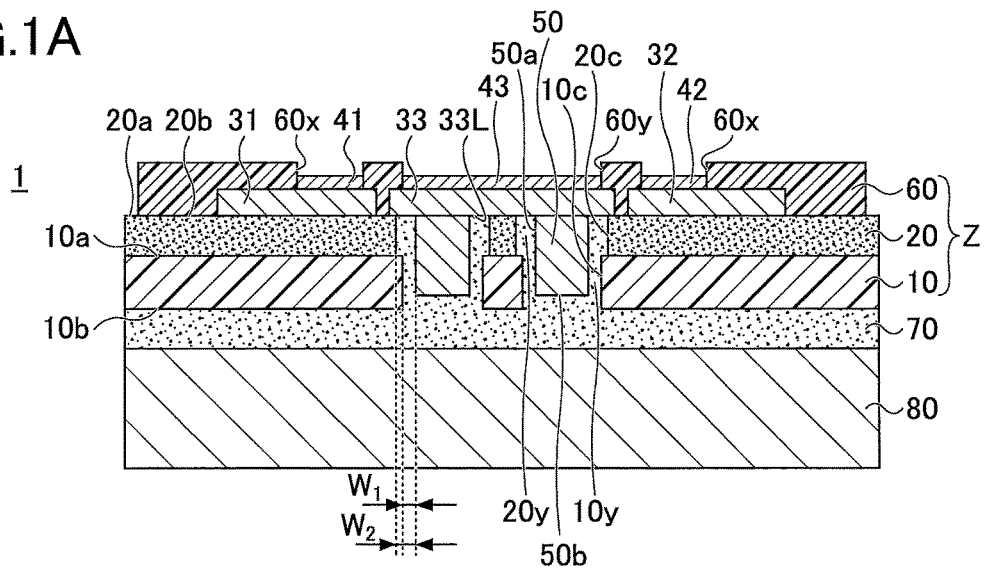
FIGS. 1A and 1B are diagrams depicting a wiring board according to a first embodiment.

According to the above-described wiring board, however, an adhesive layer is provided on a substrate that serves as the core of the wiring board. It is difficult to sufficiently adhere the substrate and the adhesive layer to each other, and as a result, the substrate and the adhesive agent may delaminate at their interface because of an external stress.

According to an aspect of the present invention, it is possible to provide a wiring board with increased adhesion between a substrate and an adhesive layer.

Preferred embodiments of the present invention will be explained with reference to accompanying drawings. In the specification and drawings, the same elements are referred to using the same reference numeral, and a repetitive description thereof may be omitted.

[a] First Embodiment

Figure 1B:
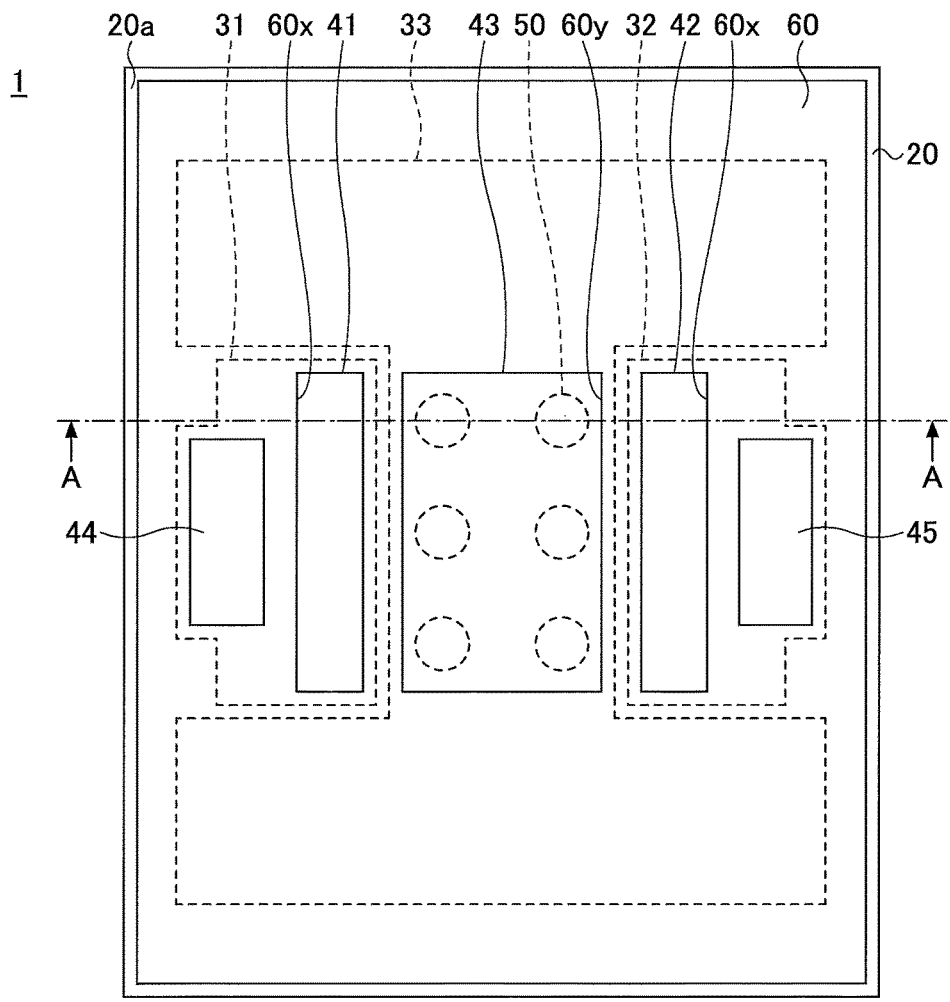

First, a structure of a wiring board according to a first embodiment is described. FIGS. 1A and 1B are diagrams depicting a wiring board according to the first embodiment. FIG. 1B is a plan view of the wiring board, and FIG. 1A is a cross-sectional view of the wiring board taken along a plane including a line A-A of FIG. 1B.

Referring to FIGS. 1A and 1B, a wiring board 1 includes a substrate 10, an adhesive layer 20, wiring patterns 31-33, plating films 41-45, vias 50, an insulating layer 60, an adhesive layer 70, and a heat spreader 80. Part of the wiring board 1 that includes the substrate 10, the adhesive layer 20, the wiring patterns 31-33, the plating films 41-45, and the vias 50 may be referred to as "wiring part Z." That is, the wiring board 1 has a structure where the wiring part Z is placed on the heat spreader 80 through the adhesive layer 70.

According to this embodiment, the insulating layer 60 side of the wiring board 1 is conveniently referred to as "upper side" or "first side" and the heat spreader 80 side of the wiring board 1 is conveniently referred to as "lower side" or "second side." Furthermore, with respect to a part or element of the wiring board 1, a surface on the insulating layer 60 side is conveniently referred to as "upper surface" or "first surface" and a surface on the heat spreader 80 side is conveniently referred to as "lower surface" or "second surface." The wiring board 1, however, may be used in an upside-down position or oriented at any angle. Furthermore, a plan view refers to a view of an object taken in a direction normal to the first surface of the substrate 10, and a planar shape refers to the shape of an object viewed in a direction normal to the first surface of the substrate 10.

According to the wiring board 1, for example, a flexible insulating resin film may be used as the substrate 10. Examples of the flexible insulating resin film include a polyimide resin film (polyimide tape), an epoxy resin film, and a polyester resin film. The substrate 10, however, is not limited to a flexible insulating resin film, and may be, for example, an FR4 (Flame Retardant Type 4) glass epoxy resin substrate. The thickness of the substrate 10 may be, for example, approximately 25 µm to approximately 75 µm.

The adhesive layer 20 is adhered to a first surface 10*a* of the substrate 10 to bond the wiring patterns 31-33 to the substrate 10. For example, a heat-resistant adhesive made of an insulating resin, such as an epoxy adhesive or a bismaleimide adhesive, may be used as the adhesive layer 20. The thickness of the adhesive layer 20 may be, for example, approximately 5 µm to approximately 15 µm. The adhesive layer 20 is a typical example of a first adhesive layer according to an aspect of the present invention.

The wiring patterns 31-33 are provided on the first surface 10*a* of the substrate 10 through the adhesive layer 20, and are electrically independent of one another. The wiring patterns 31 and 32 are wiring patterns for electrical connection to be electrically connected to terminals of one or more semiconductor devices (an electrical connection metal pattern). The wiring pattern 33 is a wiring pattern for thermal diffusion that does not contribute to the operation of a semiconductor device (a thermal diffusion metal pattern). In other words, the wiring pattern 33 is not electrically connected to the semiconductor device. That is, no electric current flows through the wiring pattern 33. The wiring patterns 31 and 32 for electrical connection and the wiring pattern 33 for thermal diffusion may be provided on the same surface of the substrate 10 (on an upper surface 20*b* of the adhesive layer 20 according to this embodiment). The wiring pattern 33 is connected to an end of each of the vias 50 penetrating through the substrate 10 and the adhesive layer 20. The form of mounting a semiconductor device on the wiring patterns 31-33 is described below.

In a plan view, the wiring pattern 33 is formed larger than and extends outside an opening 60*y* of the insulating layer 60 in which a semiconductor device, an electronic component, or a heat dissipation (thermal diffusion) terminal of the semiconductor device or the electronic component is joined to the wiring pattern 33 (the plating film 43). In other words, on the upper surface 20*b* of the adhesive layer 20, the region in which the wiring pattern 33 is formed (the formation region of the wiring pattern 33) is greater than regions in which the wiring patterns 31 and 32 are formed (the formation regions of the wiring patterns 31 and 32).

For example, referring to FIG. 1B, the wiring pattern 33 is provided in an H-shape so as to cover a region of the upper surface 20*b* of the adhesive layer 20 except for the regions in which the wiring patterns 31 and 32 are formed. The wiring patterns 31 and 32 are disposed in the opposite recesses of the H-shape of the wiring pattern 33. By thus forming the wiring pattern 33 in a widely-extended large region, the heat of a semiconductor device or an electronic component may be diffused not only vertically through the vias 50 but also laterally through the wiring pattern 33, so that it is possible to increase the heat dissipation efficiency.

The planar shape of the wiring pattern 33 is not limited to an H-shape, and may be any shape determined in view of the formation regions of the wiring patterns 31 and 32, such as a rectangular shape, a polygonal shape, a circular shape, or a combination of two or more of these shapes. In the case of these shapes, the wiring pattern 33 may be provided so that the wiring patterns 31 and 32 are opposite to each other across part of the wiring pattern 33. (See, for example, FIG. 12B).

Examples of the material of the wiring patterns 31, 32 and 33 include copper (Cu). The thickness of the wiring patterns 31-33 may be, for example, approximately 18 µm to approximately 100 µm.

The plating films 41-43 are provided on portions of the upper surfaces of the wiring patterns 31-33 exposed from the insulating layer 60, respectively. Although not depicted in the cross section of FIG. 1A, the wiring pattern 31 includes a region that serves as one external connection terminal, and the plating film 44 is provided on the region. That is, the plating films 41 and 44 are electrically connected. Likewise, the wiring pattern 32 includes a region that serves as another external connection terminal, and the plating film 45 is provided on the region. That is, the plating films 42 and 45 are electrically connected. The plating films 41-45 may have, for example, an elongated shape and be arranged side by side at predetermined intervals.

The material of the plating films 41-45 may be a laminated plating film of, for example, a Ni or Ni alloy film and a Au or Au alloy film that are stacked in this order; a Ni or Ni alloy film, a Pd or Pd alloy film, and a Au or Au alloy film that are stacked in this order; a Ni or Ni alloy film, a Pd or Pd alloy film, a Ag or Ag alloy film, and a Au or Au alloy film that are stacked in this order; a Ni or Ni alloy film and a Ag or Ag alloy film that are stacked in this order; or a Ni or Ni alloy film, a Pd or Pd alloy film, and a Ag or Ag alloy film that are stacked in this order. The material of the plating films 41-45 may also be a Ag or Ag alloy film.

Of the plating films 41-45, the Au or Au alloy film and the Ag or Ag alloy film preferably have a thickness of 0.1 µm or more, the Pd or Pd alloy film preferably has a thickness of 0.005 µm or more, and the Ni or Ni alloy film preferably has a thickness of 0.5 µm or more.

The vias 50 are for heat dissipation and are also referred to as "thermal vias." That is, the vias 50 are part of a path for transferring heat released from a semiconductor device or an electronic component toward the heat spreader 80 when a semiconductor device or an electronic component that releases heat during its operation, such as a light-emitting element, is mounted on the wiring board 1. The vias 50 are provided through the substrate 10 and the adhesive layer 20 in their thickness direction to be joined to a lower surface 33L of the wiring pattern 33. By providing the multiple (by way of example, six in the case of FIGS. 1A and 1B) vias 50 immediately under the wiring pattern 33, it is possible to improve heat dissipation.

The vias 50 are monolithically formed with the wiring pattern 33. First ends of the vias 50 are joined to the wiring pattern 33, and second ends 50b of the vias 50 are exposed from a second surface 10b of the substrate 10. The second ends 50b of the vias 50 are at depressed positions relative to the second surface 10b of the substrate 10 (positions between the first surface 10a and the second surface 10b of the substrate 10) in FIG. 1A. Alternatively, the second ends 50b of the vias 50 may be level with or projecting from the second surface 10b of the substrate 10.

The planar shape of the vias 50 may be, for example, a circular shape. In this case, the vias 50 may have a diameter of, for example, approximately 0.1 mm to 1 mm. The diameter, however, may be more than 1 mm if it is desired to improve heat dissipation in particular. The planar shape of the vias 50 may alternatively be an elliptical or rectangular shape, for example. The vias 50 may have a thickness of, for example, approximately 25 μm to approximately 75 μm. Examples of the material of the vias 50 include copper (Cu).

The vias 50 are not provided immediately under the wiring patterns 31 and 32. That is, the wiring patterns 31 and 32, which are wiring patterns for electrical connection, are formed only on a flat surface (the upper surface 20b of the adhesive layer 20). That is, there are only the adhesive layer 20, the substrate 10, and the adhesive layer 70 between the wiring patterns 31 and 32 and the heat spreader 80. Neither the vias 50 nor other wiring patterns for electrical connection are present in a region that coincides with the wiring patterns 31 and 32 in a plan view in the adhesive layer 20, the substrate 10, and the adhesive layer 70. According to this structure, it is possible to improve the electrical insulation between the wiring patterns 31 and 32 and the heat spreader 80.

The insulating layer 60 is a reflective film provided on the substrate 10 in order to increase reflectance with respect to the light emitted from a light-emitting element and the rate of dissipating heat released from the light-emitting element when a semiconductor device mounted on the wiring board 1 is a light-emitting element. The insulating layer 60 includes openings 60x that selectively expose the wiring patterns 31 and 32 and the opening 60y that selectively exposes the wiring pattern 33. As described above, the plating films 41-45 are provided on the wiring patterns 31-33 exposed from the insulating layer 60. The material of the insulating layer 60 may be, for example, a silicone resin such as an epoxy resin or organopolysiloxane that is mixed with a filler or pigment such as titanium oxide ($TiO_2$) or barium sulfate ($BaSO_4$). White ink made of this mixture of materials may be used as the material of the insulating layer 60.

Preferably, the insulating layer 60 is provided so as to expose a peripheral edge part 20a of the insulating layer 20. Providing the insulating layer 60 in this manner makes it unnecessary to cut the insulating layer 60 when multiple regions to ultimately become wiring boards 1 are simultaneously formed and finally separated (cut) into individual pieces in the manufacturing process of the wiring board 1, so that it is possible to prevent chipping or removal of a peripheral edge of the insulating layer 60. As a result, it is possible to prevent a decrease in the surface area of the insulating layer 60 and accordingly to prevent a decrease in the reflectance of the insulating layer 60.

First openings 10y (a first gap) having an annular shape are provided in the substrate 10 so as to expose peripheral surfaces 50a of the vias 50. In other words, the first openings 10y are defined as gaps disposed between side surfaces 10c of the substrate 10 and the peripheral surfaces 50a of the vias 50.

Furthermore, second openings 20y (a second gap) having an annular shape are provided in the adhesive layer 20 so as to communicate with the first openings 10y and expose the peripheral surfaces 50a of the vias 50 and the lower surface 33L of the wiring pattern 33. In other words, the second openings 20y are defined as gaps disposed between side surfaces 20c of the adhesive layer 20 and the peripheral surfaces 50a of the vias 50.

The second openings 20y are greater in width than the first openings 10y.

For example, when the vias 50 have a circular planar shape, it is possible to form the first openings 10y and the second openings 20y that have an annular planar shape and expose the peripheral surfaces 50a of the vias 50. Furthermore, it is possible to form the second openings 20y with a width W2 (lateral dimension) greater than a width W1 (lateral dimension) of the first openings 10y. That is, the opening size (gap size) (outside diameter) of the second openings 20y is greater than the opening size (gap size) (outside diameter) of the first openings 10y. For example, the width W2 of the second openings 20y may be 0.075 mm, and the width W1 of the first openings 10y may be 0.025 mm.

The adhesive layer 70 is provided on the heat spreader 80. The adhesive layer 70 is in contact with the peripheral surfaces 50a and lower end surfaces of the vias 50 at their respective second ends 50b. Furthermore, the adhesive layer 70 is in contact with the second surface 10b of the substrate 10, the side surfaces 10c of the substrate 10 exposed in the first openings 10y, the first surface 10a of the substrate 10 exposed in the second openings 20y, the side surfaces 20c of the adhesive layer 20 exposed in the second openings 20y, and the lower surface 33L of the wiring pattern 33 exposed in the second openings 20y.

The adhesive layer 70 fills in the first openings 10y and the second openings 20y. That is, the adhesive layer 70 fills in the gaps formed by the peripheral surfaces 50a of the vias 50, the side surfaces 10c of the substrate 10 exposed in the first openings 10y, the side surfaces 20c of the adhesive layer 20 exposed in the second openings 20y, and the lower surface 33L of the wiring pattern 33 exposed in the second openings 20y. In other words, the vias are buried in the adhesive layer 70 within the substrate 10 and the adhesive layer 20 with the distance between the peripheral surface 50a of each via 50 and the side surface 20c around the via 50 being greater than the distance between the peripheral surface 50a of the via 50 and the side surface 10c around the via 50.

It is preferable to use a material having high thermal conductivity for the adhesive layer 70 because the adhesive layer 70 forms part of a path for transferring heat transmitted from the vias 50 toward the heat spreader 80. For example, a heat-resistant adhesive made of an insulating resin, such as an epoxy adhesive or a bismaleimide adhesive, and containing a filler such as alumina may be used as the adhesive layer 20. The thickness of the part of the adhesive layer 70 held between the substrate 10 and the heat spreader 80 may be, for example, approximately 20 μm to approximately 50 μm. The adhesive layer 70 is a typical example of a second adhesive layer according to an aspect of the present invention.

The heat spreader 80 is adhered to the second surface 10b of the substrate 10 with the adhesive layer 70. That is, the second surface 10b of the substrate 10 is bonded to the heat spreader 80 through the adhesive layer 70. For example, a plate formed of a metal having good thermal conductivity, such as copper (Cu) or aluminum (Al), may be used as the material of the heat spreader 80. An insulating plate formed of an insulating material having high thermal conductivity, for example, a ceramic such as alumina or aluminum nitride or silicon, may also be used as the heat spreader 80. The thickness of the heat spreader 80 may be, for example, approximately 100 μm to approximately 1000 μm. When the heat dissipation characteristic is required in particular, the thickness of the heat spreader 80 may be approximately a few millimeters.

Here, the effect of providing the vias 50 only immediately under the wiring pattern 33 and providing no vias 50 immediately under the wiring patterns 31 and 32 is described. It is assumed that the vias 50 are provided immediately under the wiring patterns 31 and 32. In this case, the second ends 50b of the vias 50 exposed from the second surface 10b of the substrate 10 face the heat spreader 80 across the adhesive layer 70 containing a filler such as alumina. In particular, when the adhesive layer 70 is thin (for example, approximately 20 μm to approximately 50 μm in thickness), there may be a leakage of electric current from the vias 50 to the heat spreader 80 through the adhesive layer 70, thus reducing electrical insulation, because the wiring patterns 31 and 32 are for electrical connection.

Therefore, in the case of providing the vias 50 immediately under the wiring patterns 31 and 32, it is desired to ensure electrical insulation by increasing the thickness of the adhesive layer 70 to some extent (for example, approximately 100 μm to approximately 150 μm). The adhesive layer 70, however, is part of the heat dissipation (transfer) path located between the vias 50 and the heat spreader 80. Therefore, increasing the thickness of the adhesive layer 70 in order to ensure electrical insulation increases thermal resistance and decreases heat dissipation. That is, providing the vias 50 immediately under the wiring patterns 31 and 32 makes it difficult to achieve both electrical insulation and heat dissipation.

Meanwhile, according to this embodiment, no vias 50 are provided immediately under the wiring patterns 31 and 32. Therefore, there is no possibility of reduction in electrical insulation even when the thickness of the adhesive layer 70 is reduced (to, for example, approximately 50 μm) to decrease thermal resistance. Furthermore, while the vias 50 are provided immediately under the wiring pattern 33, no electric current flows through the wiring pattern 33 because the wiring pattern 33 is for thermal diffusion and has no electrical connection to a semiconductor device or an electronic component mounted on the wiring board 1. Accordingly, there is no leakage of electric current even when the second ends of the vias 50 face the heat spreader 80 across the relatively thin adhesive layer 70 (for example, approximately 20 μm to approximately 50 μm in thickness).

By thus providing no vias 50 immediately under the wiring patterns 31 and 32 and providing the vias 50 only immediately under the wiring pattern 33 in which no electric current flows, it is possible to ensure electrical insulation and improve heat dissipation at the same time even in the case of using the relatively thin adhesive layer 70.

Next, the effect of providing the first openings 10y and the second openings 20y that expose the peripheral surfaces 50a of the vias 50 and filling the first openings 10y and the second openings 20y with the adhesive layer 70 is described.

The case of providing neither the first openings 10y nor the second openings 20y is assumed. In this case, the peripheral surfaces 50a of the vias 50 are seemingly in contact with the substrate 10 and the adhesive layer 20. The substrate 10, however, is formed of a film-shaped material or a rigid material to have no fluidity. Therefore, in a micron-scale view, the peripheral surfaces 50a of the vias 50 and the substrate 10 are not in complete contact, and there are voids (gaps) between the peripheral surfaces 50a of the vias 50 and the substrate 10. Furthermore, when forming the vias 50, the adhesive layer 20 is already hardened with no fluidity. Therefore, at the micron scale, the peripheral surfaces 50a of the vias 50 and the adhesive layer 20 are not in complete contact, and there are voids (gaps) between the peripheral surfaces 50a of the vias 50 and the adhesive layer 20. The presence of voids may cause explosion of water vapor remaining in the voids at the time of reflow, thus serving as a factor in reducing the reliability of the wiring board 1.

On the other hand, according to this embodiment, the first openings 10y and the second openings 20y that expose the peripheral surfaces 50a of the vias 50 are provided, and are filled with the adhesive layer 70. Before hardening, the adhesive layer 70 is in liquid form or paste form with fluidity. Therefore, the adhesive layer 70 flows into the first openings 10y and the second openings 20y along the shape of the peripheral surfaces 50a of the vias 50 and, even if there are minute depressions on the peripheral surfaces 50a of the vias 50, fills in the first openings 10y and the second openings 20y so as to fill in the depressions. Thereafter, by hardening the adhesive layer 70, the peripheral surfaces 50a of the vias 50 and the adhesive layer 70 are bonded with no voids at their interface. As a result, the possibility of the explosion of water vapor remaining in voids at the time of reflow is eliminated, so that it is possible to increase the reliability of the wiring board 1.

Furthermore, because the second openings 20y are wider than the first openings 10y, the adhesive layer 70 is formed in contact with the first surface 10a of the substrate 10 exposed in the second openings 20y. Part of the adhesive layer 70 that comes into contact with the first surface 10a of the substrate 10 exposed in the second openings 20y serves as a wedge, thus making it possible to prevent delamination of the substrate 10 and the adhesive layer 70 due to an external stress. That is, it is possible to increase the adhesion between the substrate 10 and the adhesive layer 70.

Furthermore, because the adhesive layer 70 contains a filler such as alumina to have high thermal conductivity, it is possible to efficiently transfer heat from the wiring pattern 33 to the heat spreader 80 through the adhesive layer 70.

The substrate 10 of high electrical insulation formed of, for example, a polyimide is present in a region that coincides with the wiring patterns 31 and 32 in which an electric current flows in a plan view. Therefore, even when the above-described structure is adopted, it is possible to ensure the reliability of the electrical insulation of the wiring board 1.

Next, a method of manufacturing a wiring board according to the first embodiment is described. FIGS. 2A-2D, FIGS. 3A and 3B, FIGS. 4A and 4B, FIGS. 5A and 5B, FIGS. 6A and 6B, FIGS. 7A and 7B, FIGS. 8A and 8B, and FIGS. 9A-9D are diagrams depicting a method of manufacturing a wiring board according to the first embodiment. Each of the cross-sectional views employed in the description of a method of manufacturing a wiring board according to the first embodiment corresponds to the cross-sectional view of FIG. 1A.

Figure 2A:
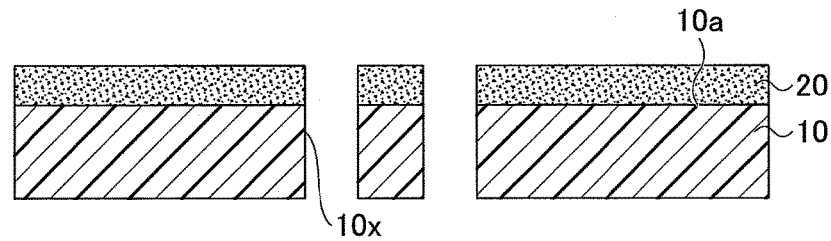
FIGS. 2A-2D are diagrams depicting a process of manufacturing a wiring board according the first embodiment.

First, in the process depicted in FIG. 2A, for example, a polyimide film in reel (tape) form is prepared as the substrate 10, and an epoxy adhesive is applied on the first surface 10a of the substrate 10 to form the adhesive layer 20. Instead of applying an epoxy adhesive, an epoxy adhesive film may be adhered to the first surface 10a of the substrate 10 to form the adhesive layer 20. Then, through holes 10x are formed through the substrate 10 and the adhesive layer 20. The through holes 10x may be formed by punching. While the substrate 10, etc., include multiple regions to become wiring boards 1, only one of the regions is depicted in FIGS. 2A-9D.

Figure 2B:
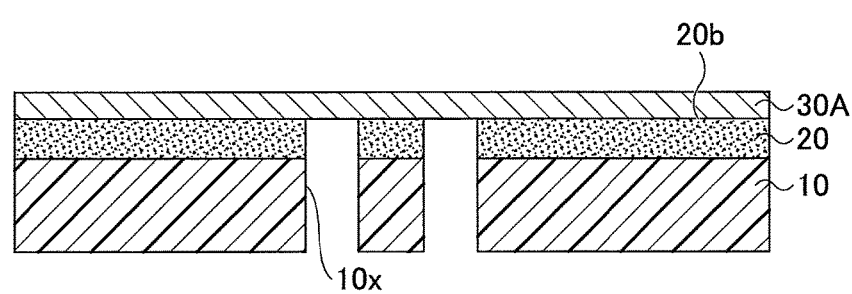

Next, in the process depicted in FIG. 2B, a metal layer 30A to be ultimately patterned into the wiring patterns 31-33 is formed on the adhesive layer 20, and heating to a predetermined temperature is performed to harden the adhesive layer 20. The metal layer 30A may be formed by, for example, laminating the upper surface 20b of the adhesive layer 20 with copper foil. The thickness of the metal layer 30A may be, for example, approximately 18 μm to approximately 100 μm. Thereafter, the structure depicted in FIG. 2B is immersed in a wet etching solution (for example, a hydrogen peroxide solution) to etch a lower surface of the metal layer 30A exposed in the through holes 10x and an upper surface of the metal layer 30A (so-called soft etching). By this etching, a corrosion inhibitor present on the surfaces of the metal layer 30A is removed, and the surfaces of the metal layer 30A are slightly removed to a certain depth (for example, approximately 0.5 μm to approximately 1 μm). This etching may be performed as required and is not an essential process.

Figure 2C:
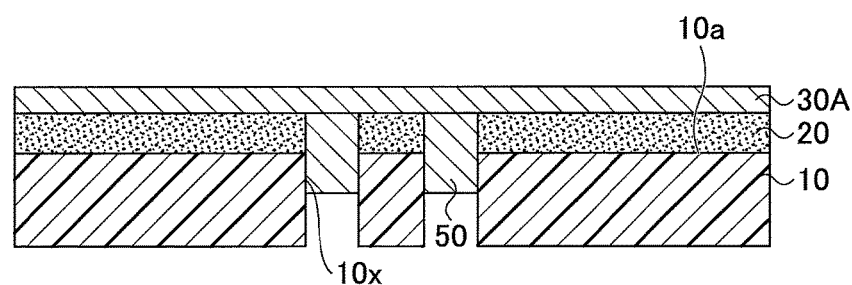

Next, in the process depicted in FIG. 2C, the vias 50 are formed in the through holes 10x so as to be monolithically connected to the metal layer 30A. Specifically, for example, first, masking tape (not depicted) is applied on the upper surface of the metal layer 30A. The masking tape covers the upper surface of the metal layer 30A so as to prevent the growth of a plating film on the upper surface of the metal layer 30A when forming the vias 50 by electroplating.

After the application of the masking tape, the vias 50 are formed by electroplating with the metal layer 30A serving as a feeding layer, and the masking tape is removed. The vias 50 are formed in a columnar shape by filling the through holes 10x with plating metal by causing the plating metal to deposit on the lower surface of the metal layer 30A exposed in the through holes 10x. The vias 50 are formed so as to have respective first ends (upper ends in FIG. 2C) connected to the metal layer 30A and respective second ends (lower ends in FIG. 2C) exposed from the second surface of the substrate 10.

In the process of forming the vias 50, the vias 50 are formed so that the second ends of the vias 50 are at depressed positions relative to the second surface of the substrate 10 (positions between the first surface 10a and the second surface of the substrate 10). By causing plating metal to deposit so that the second ends of the vias 50 are at depressed positions relative to the second surface of the substrate 10, it is possible to form the vias 50 so that the second ends of the vias 50 are prevented from projecting from the second surface of the substrate 10 (see FIG. 6A) or are level with the second surface of the substrate 10 (see FIG. 7A) in the below-described plasma etching. Therefore, it is possible to reduce the thickness of the wiring part Z and ensure the flatness of the wiring part Z at the time of joining the wiring part Z to the heat spreader 80.

Figure 2D:
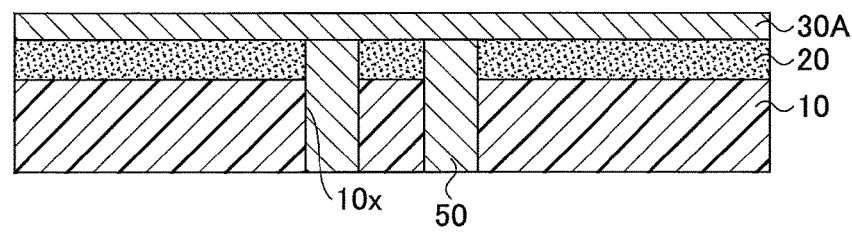

In the process of forming the vias 50, the vias 50 may alternatively be formed so that the second ends of the vias 50 are level with the second surface of the substrate 10 as depicted in FIG. 2D. In this case, the second ends of the vias 50 project from the second surface of the substrate 10 in the below-described plasma etching (see FIG. 7B), so that it is possible to improve heat dissipation with the increased surface area of the vias 50. Examples of the material of the vias 50 include copper (Cu).

Figure 3A:
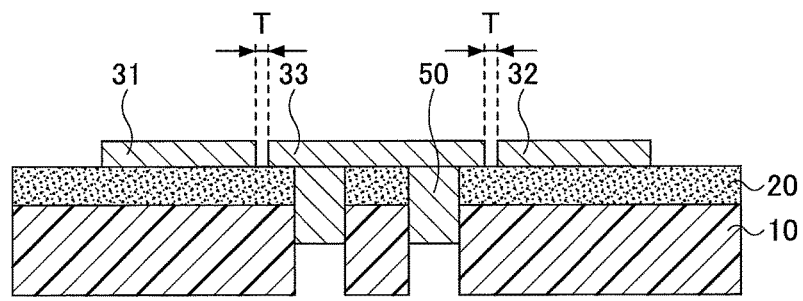
FIGS. 3A and 3B are diagrams depicting the process of manufacturing a wiring board according the first embodiment.
Figure 3B:
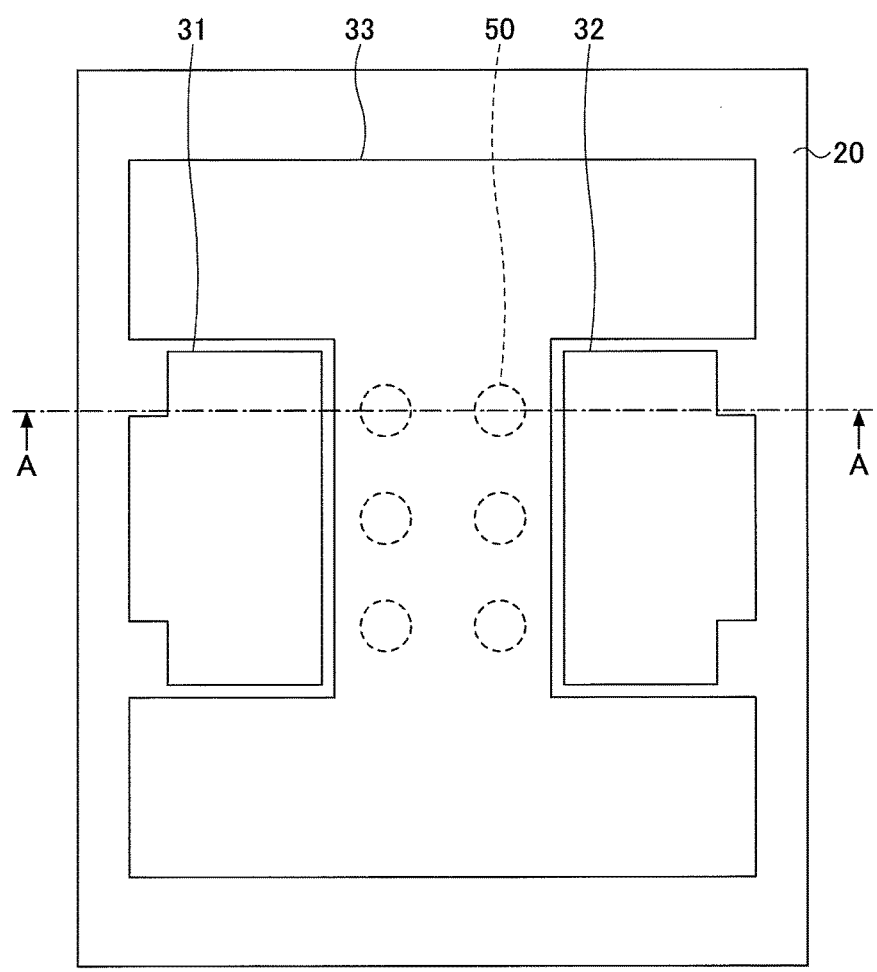

Next, in the process depicted in FIGS. 3A and 3B (where FIG. 3B is a plan view and FIG. 3A is a cross-sectional view taken along a plane including a line A-A of FIG. 3B), the metal layer 30A is patterned to form the wiring patterns 31-33. In FIGS. 3A and 3B, a depiction of bus lines connected to the wiring patterns 31-33, which are formed simultaneously with the wiring patterns 31-33 in order to form the plating films 41-45 by electroplating in a later process, is omitted. Specifically, the wiring patterns 31-33 are formed by, for example, applying a resist (not depicted) on the metal layer 30A and exposing the resist to a pattern of light that matches the pattern of the wiring patterns 31-33 and the bus lines, so that the pattern of the wiring patterns 31-33 and the bus lines is developed in the resist. Then, by performing etching using the resist, the wiring patterns 31-33 and the bus lines are formed (patterned). Thereafter, the resist is removed.

At this point, if spaces T between the wiring pattern 33 and the wiring patterns 31 and 32 are narrow, application of voltage to the wiring pattern 31 or 32 may induce reverse voltage in the adjacent wiring pattern 33 to affect the reliability of electrical insulation from the heat spreader 80. Therefore, the space T between the wiring pattern 31 and the adjacent wiring pattern 33 and the space T between the wiring pattern 32 and the adjacent wiring pattern 33 are desired to be so wide as to prevent induction of voltage.

Figure 4A:
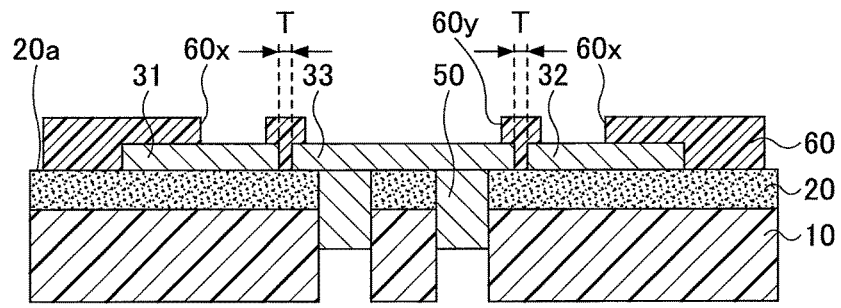
FIGS. 4A and 4B are diagrams depicting the process of manufacturing a wiring board according the first embodiment.
Figure 4B:
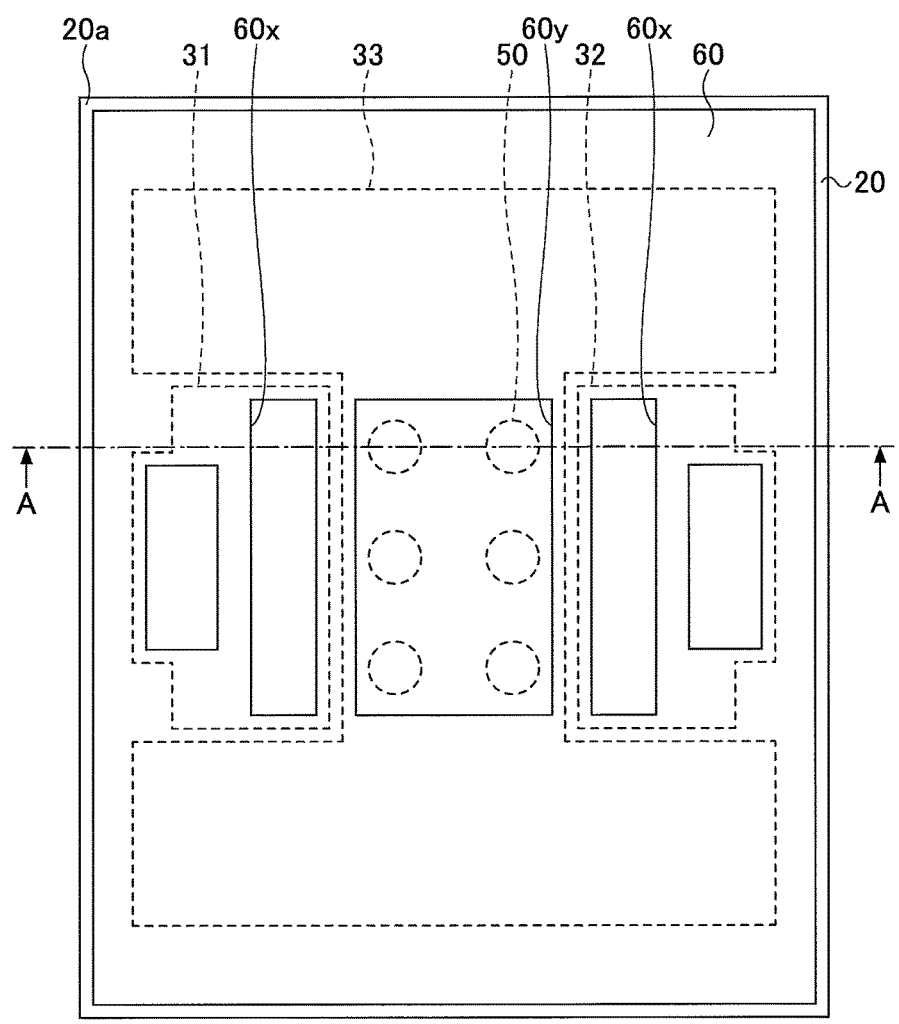

Next, in the process depicted in FIGS. 4A and 4B (where FIG. 4B is a plan view and FIG. 4A is a cross-sectional view taken along a plane including a line A-A of FIG. 4B), the insulating layer 60 (a reflective film) is formed so as to selectively expose parts of the wiring patterns 31-33 (where the plating films 41-45 are to be later formed). Specifically, the insulating layer 60 that includes the openings 60x that selectively expose parts of the wiring patterns 31 and 32 and the opening 60y that selectively exposes part of the wiring pattern 33 is formed.

The insulating layer 60 is so formed as to fill in the space T between the wiring pattern 31 and the adjacent wiring pattern 33 and the space T between the wiring pattern 32 and the adjacent wiring pattern 33. By interposing the insulating layer 60 between the wiring pattern 33 and the wiring patterns 31 and 32, it is possible to improve electrical insulation and reflection efficiency.

As described above, a white color material may be used as the insulating layer 60. For example, the insulating layer 60 may be formed by a process such as screen printing. Alternatively, the insulating layer 60 may be formed by applying white ink so as to cover the entirety of the wiring patterns 31-33 with the white ink and thereafter exposing parts of the wiring patterns 31-33 where the plating films 41-45 are to be formed, using a technique such as photolithography, blasting, or laser processing.

The insulating layer 60 is preferably formed so as to expose the peripheral edge part 20a of the insulating layer 20 of each of multiple regions to become wiring boards 1. This is because by thus forming the insulating layer 60, it becomes unnecessary to cut the insulating layer 60 when separating (cutting) the regions to become wiring boards 1 into individual pieces, so that it is possible to prevent chipping or removal of a peripheral edge of the insulating layer 60. As a result, it is possible to prevent diffuse reflection on a surface of the insulating layer 60 due to the chipping or removal of the insulating layer 60, so that it is possible to prevent a decrease in the reflectance of the insulating layer 60. The insulating layer 60 may be formed so as not to expose the peripheral edge part 20a of the insulating layer 20 as required (see FIG. 9D).

Figure 5A:
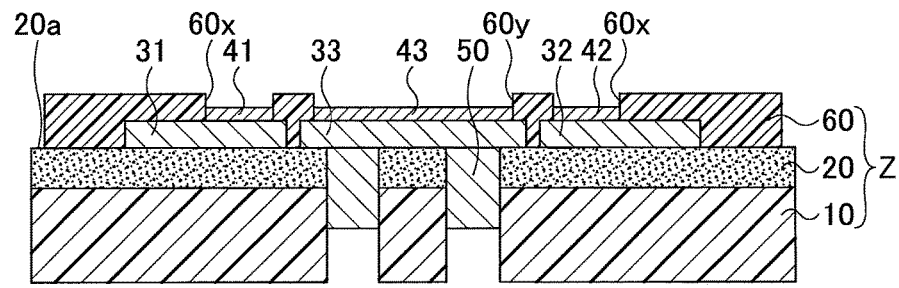
FIGS. 5A and 5B are diagrams depicting the process of manufacturing a wiring board according the first embodiment.
Figure 5B:
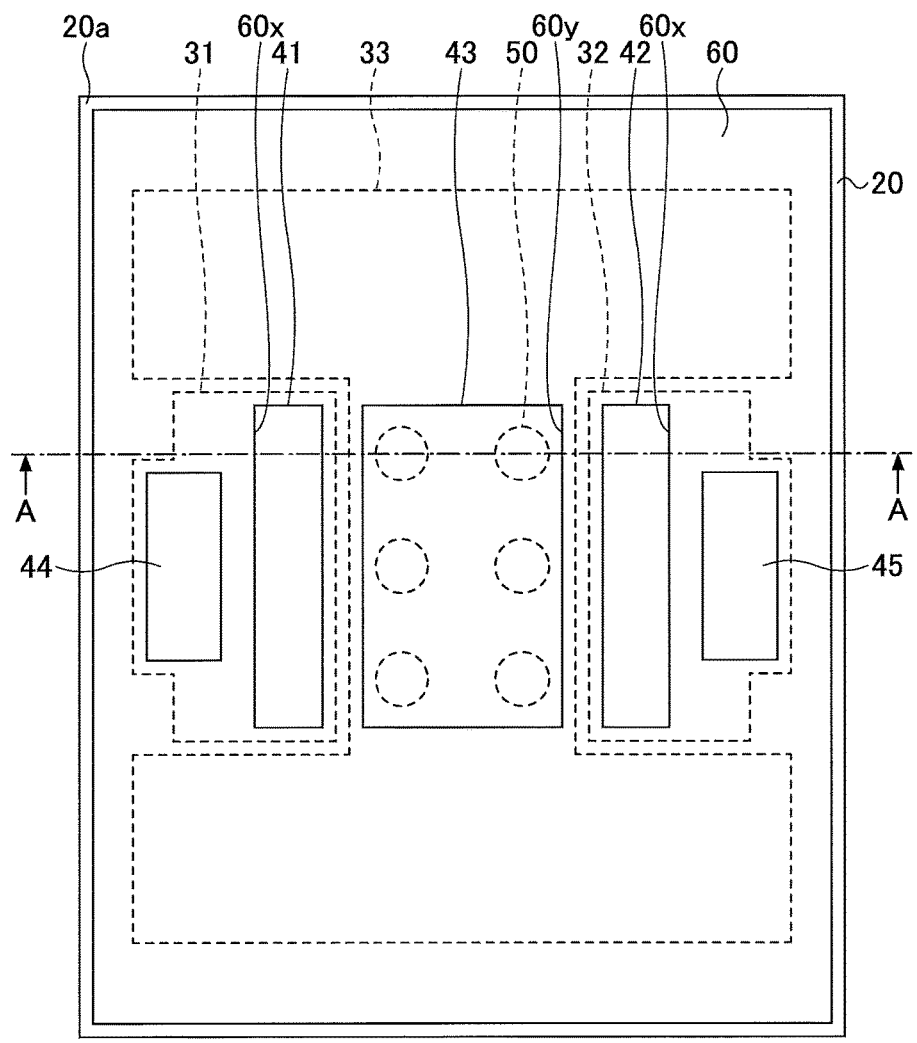

Next, in the process depicted in FIGS. 5A and 5B (where FIG. 5B is a plan view and FIG. 5A is a cross-sectional view taken along a plane including a line A-A of FIG. 5B), the plating films 41-45 are formed on the wiring patterns 31-33 by electroplating. Specifically, for example, masking tape (not depicted) is applied on the second surface of the substrate 10. Then, electroplating is performed through a feeding path including the bus lines connected to the wiring patterns 31-33, so that the plating films 41-45 are formed on the upper surfaces of parts of the wiring patterns 31-33 exposed from the insulating layer 60. Thereafter, the masking tape is removed. The material, thickness, etc., of the plating films 41-45 are as described above.

Figure 6A:
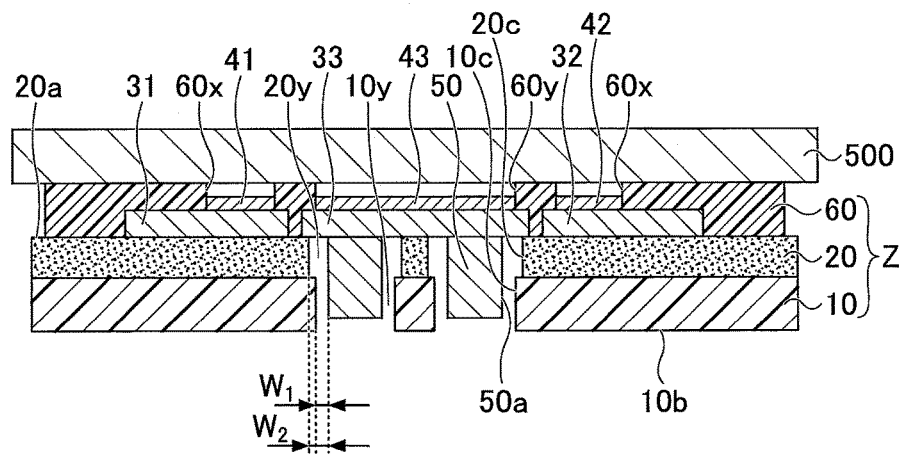
FIGS. 6A and 6B are diagrams depicting the process of manufacturing a wiring board according the first embodiment.
Figure 6B:
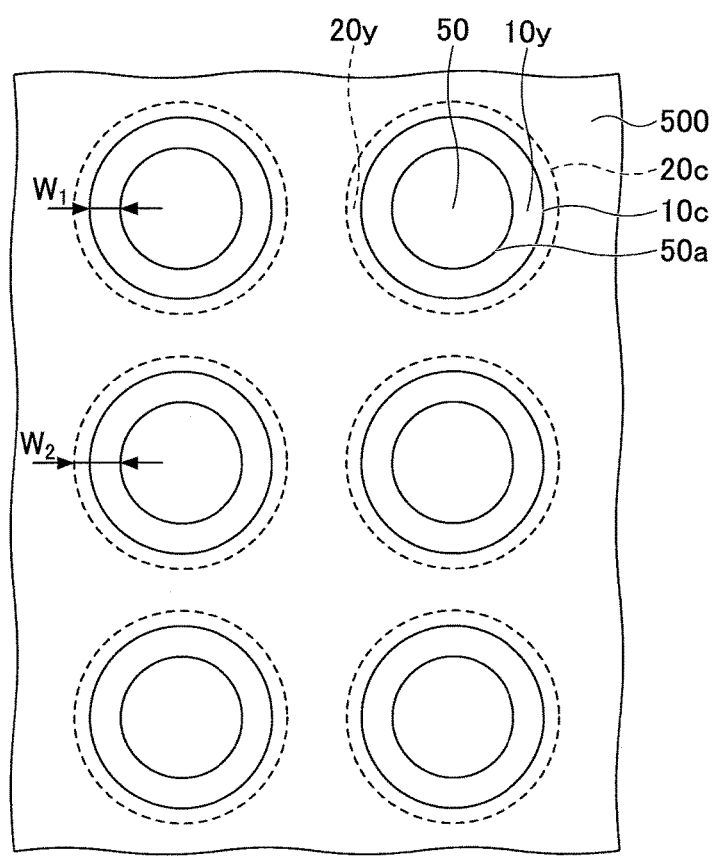

Next, in the process depicted in FIGS. 6A and 6B (where FIG. 6A is a cross-sectional view, and FIG. 6B is a bottom view of part of the structure of FIG. 6A, depicting a vicinity of the vias 50), the first openings 10y are formed in the substrate 10 and the second openings 20y are formed in the adhesive layer 20 so as to expose the peripheral surface 50a of each of the vias 50. Specifically, masking tape 500 is applied on the upper surface (surface facing away from the substrate 10) of the insulating layer 60. Then, plasma etching is performed on the second surface of the substrate 10. The masking tape 500 is provided so as to prevent a plasma from moving around and performing etching on the insulating layer 60 side at the time of plasma etching.

The entire second surface of the substrate 10 is etched by plasma etching, so that the thickness of the substrate 10 is reduced. Furthermore, etching is also performed at the interface between the peripheral surfaces of the vias 50 and the substrate 10 and the adhesive layer 20 in the thickness direction, so that side surfaces of the substrate 10 and the adhesive layer 20 around the vias 50 are etched approximately as much as the second surface of the substrate 10 is etched. As a result, the first openings 10y are formed in the substrate 10, and the second openings 20y that communicate with the first openings 10y are formed in the adhesive layer 20.

At this point, because the adhesive layer 20 is easier to etch than the substrate 10, the second openings 20y are formed to have the width W2 greater than the width w1 of the first openings 10y. For example, in the case where the vias 50 have a circular planar shape, the first openings 10y and the second openings 20y that have circular planar shapes and expose the peripheral surfaces 50a of the vias 50 are formed with the opening size (outer diameter) of the second openings 20y being greater than the opening size (outside diameter) of the first openings 10y. That is, there is a step between each side surface 10c of the substrate and the corresponding side surface 20c of the adhesive layer 20.

Figure 7A:
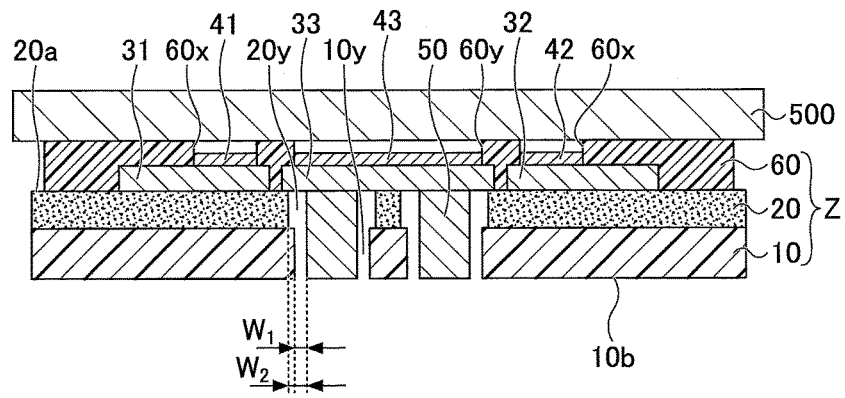
FIGS. 7A and 7B are diagrams depicting the process of manufacturing a wiring board according the first embodiment.
Figure 7B:
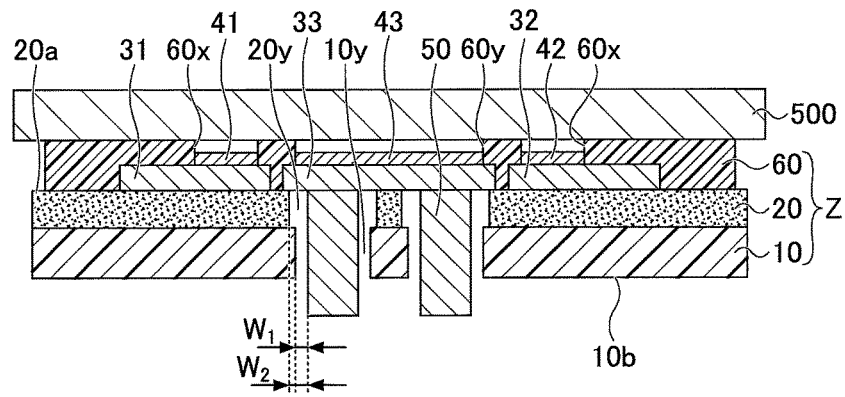

Furthermore, as described above, the second surface of the substrate 10 is etched by plasma etching. Therefore, the second ends 50b of the vias 50 are formed at depressed positions relative to the second surface 10b of the substrate 10. Alternatively, however, the second ends 50b of the vias 50 may be level with the second surface 10b of the substrate 10 as depicted in FIG. 7A, or the second ends 50b of the vias 50 may project from the second surface 10b of the substrate 10 as depicted in FIG. 7B.

After the formation of the first openings 10y and the second openings 20y, the masking tape 500 is removed. Then, singulation is performed by cutting a peripheral edge part (the substrate 10, the adhesive layer 20, etc., in a region exposed from the insulating layer 60) of the structure depicted in FIGS. 6A and 6B after the removal of the masking tape 500 by, for example, press working, numerical control machining, or laser processing. The bus lines connected to the wiring patterns 31-33 are also cut at the same time. As a result, multiple wiring parts Z for wiring boards 1 are formed.

Figure 8A:
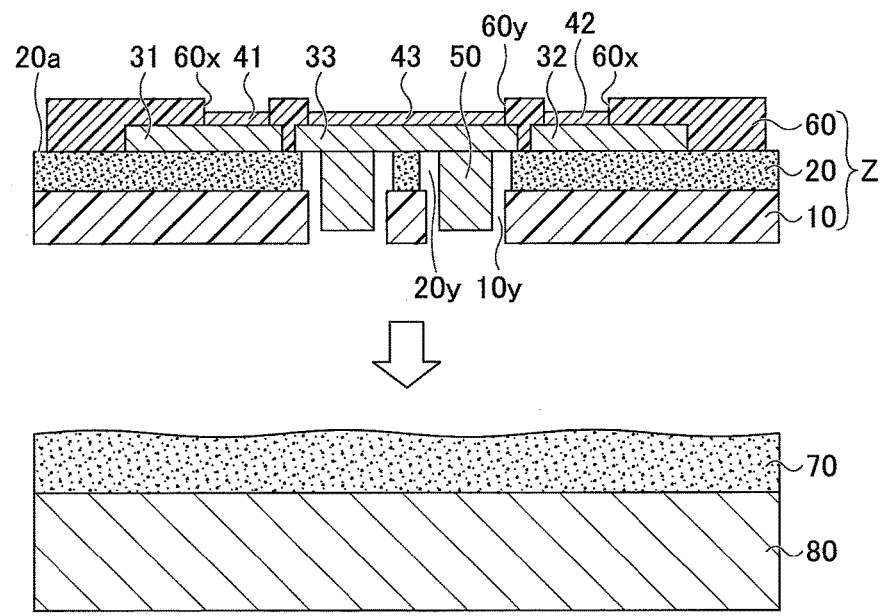
FIGS. 8A and 8B are diagrams depicting the process of manufacturing a wiring board according the first embodiment.

Next, in the process depicted in FIG. 8A, the adhesive layer 70 is formed on the heat spreader 80, and the single piece of the wiring part Z is bonded onto the heat spreader 80 through the adhesive layer 70. Specifically, for example, the adhesive layer 70 is formed by applying a thermosetting epoxy resin in liquid or paste form containing a filler such as alumina on the heat spreader 80 by spin coating, and the single piece of the wiring part Z is placed on the adhesive layer 70.

Figure 8B:
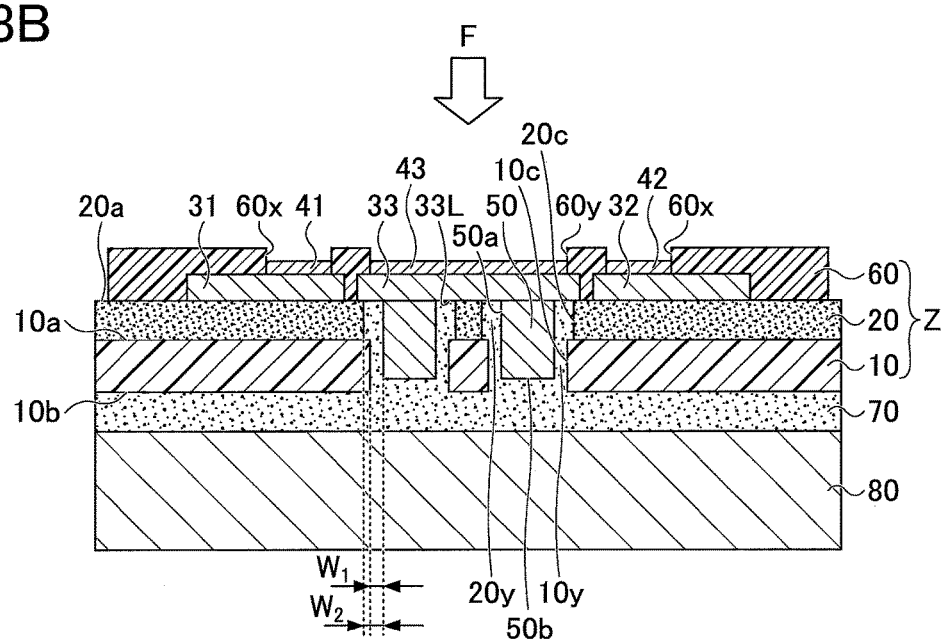

Next, in the process depicted in FIG. 8B, the single piece of the wiring part Z is pressed in the direction of arrow F (toward the heat spreader 80). As a result, the adhesive layer 70 flows into and fills in the first openings 10y and the second openings 20y. That is, the adhesive layer 70 fills in the gaps formed by the peripheral surfaces 50a of the vias 50, the side surfaces 10c of the substrate 10 exposed in the first openings 10y, the side surfaces 20c of the adhesive layer 20 exposed in the second openings 20y, and the lower surface 33L of the wiring pattern 33 exposed in the second openings 20y. At this point, because the adhesive layer 70 has fluidity, no voids are formed at the interface between the peripheral surfaces 50a of the vias 50 and the adhesive layer 70.

As a result, the adhesive layer 70 comes into contact with the peripheral surfaces 50a and the lower end surfaces of the vias 50. Furthermore, the adhesive layer 70 comes into contact with the second surface 10b of the substrate 10, the side surfaces 10c of the substrate 10 exposed in the first openings 10y, the first surface 10a of the substrate 10 exposed in the second openings 20y, the side surfaces 20c of the adhesive layer 20 exposed in the second openings 20y, and the lower surface 33L of the wiring pattern 33 exposed in the second openings 20y. Then, the adhesive layer 70 is heated to a predetermined temperature to be hardened while filling in the first openings 10y and the second openings 20y. By the above-described process, multiple wiring boards 1 (see FIGS. 1A and 1B) are completed.

According to the above-described manufacturing method, a single piece of structure (the wiring part Z) is bonded to the heat spreader 80 through the adhesive layer 70, but this is a non-limiting example. Alternatively, for example, the adhesive layer 70 filling in the first openings 10y and the second openings 20y and covering the lower surface 10b of the substrate 10 may be formed on a structure (wiring part Z) in which bus lines are cut, and the structure (wiring part Z) and the adhesive layer 70 are reduced to individual pieces. Then, each individual structure (the wiring part Z and the adhesive layer 70) may be stacked on the heat spreader 80 at a predetermined temperature and pressure. As another alternative, for example, the wiring part Z may be bonded to the heat spreader 80 through the adhesive layer 70, and thereafter, the wiring part Z, the adhesive layer 70, and the heat spreader 80 may be reduced to individual pieces. In the case of this process, side surfaces of the wiring part Z, the adhesive layer 70, and the heat spreader 80 are, for example, in a single plane. According to this embodiment, the adhesive layer 20 and the substrate 10 of the wiring part Z, the adhesive layer 70, and the heat spreader 80 are depicted as having the same planar shape (with their side surfaces in the same plane). This embodiment, however, is not limited to this configuration, and the wiring part Z and the adhesive layer 70 may have a planar shape smaller than the planar shape of the heat spreader 80.

The process depicted in FIGS. 3A-5B may be replaced with the process depicted in FIGS. 9A-9D. First, in the process depicted in FIG. 9A, the metal layer 30A is patterned to form the wiring patterns 31-33 and bus lines (not depicted) connected to the wiring patterns 31-33 in the same manner as in the process depicted in FIGS. 3A and 3B.

Figure 9A:
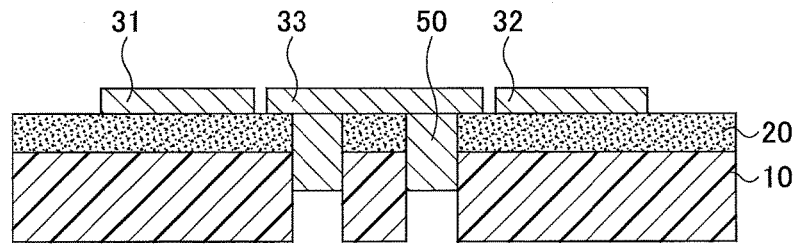
FIGS. 9A-9D are diagrams depicting the process of manufacturing a wiring board according the first embodiment.
Figure 9B:
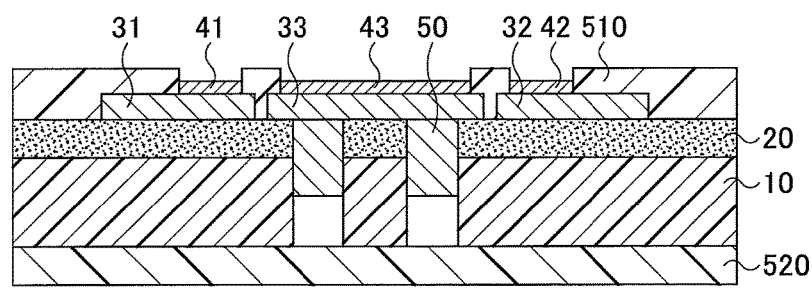
Figure 9C:
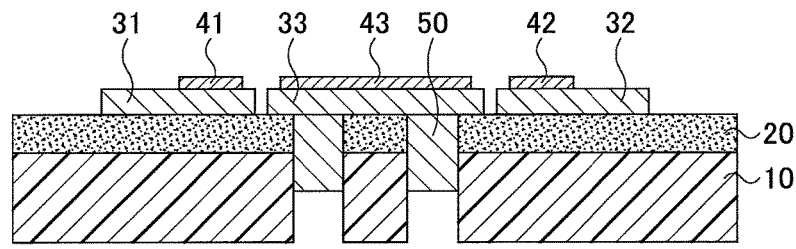

Next, in the process depicted in FIG. 9B, the plating films 41-45 are formed on the wiring patterns 31-33 by electroplating. Specifically, for example, a resist film 510 that selectively exposes predetermined parts (where the plating films 41-45 are formed in FIGS. 1A and 1B) of the upper surfaces of the wiring patterns 31-33 is formed on the adhesive layer 20. Furthermore, masking tape 520 is adhered to the second surface of the substrate 10. Then, electroplating is performed through a feeding path including the bus lines connected to the wiring patterns 31-33, so that the plating films 41-45 are formed on the parts of the upper surfaces of the wiring patterns 31-33 exposed from the resist film 510. The material, thickness, etc., of the plating films 41-45 are as described above. Next, in the process depicted in FIG. 9C, the resist film 510 and the masking tape 520 are removed.

Figure 9D:
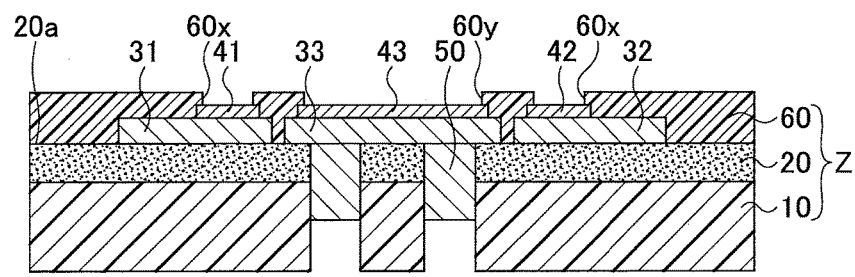

Next, in the process depicted in FIG. 9D, the insulating layer 60 is formed on predetermined parts of the wiring patterns 31-33 (so as to expose the plating films 41-45 except for their peripheral edge parts) in the same manner as in the process depicted in FIGS. 4A and 4B. FIG. 9D depicts the case of providing the insulating layer 60 without exposing the peripheral edge part 20a of the adhesive layer 20.

Finally, singulation is performed by cutting a peripheral edge part of the structure depicted in FIG. 9D by a process such as press working, and thereafter, the same process as depicted in FIGS. 6A-8B is performed. By the above-described process, multiple wiring boards 1 are completed.

First Variation of First Embodiment

According to a first variation of the first embodiment, an adhesive layer that fills in the first openings 10y and the second openings 20y and an adhesive layer that fixes the wiring part Z onto the heat spreader 80 are separately provided. In the first variation of the first embodiment, the same components as those of the above-described embodiment are referred to using the same reference numeral, and a description thereof is omitted.

Figure 10A:
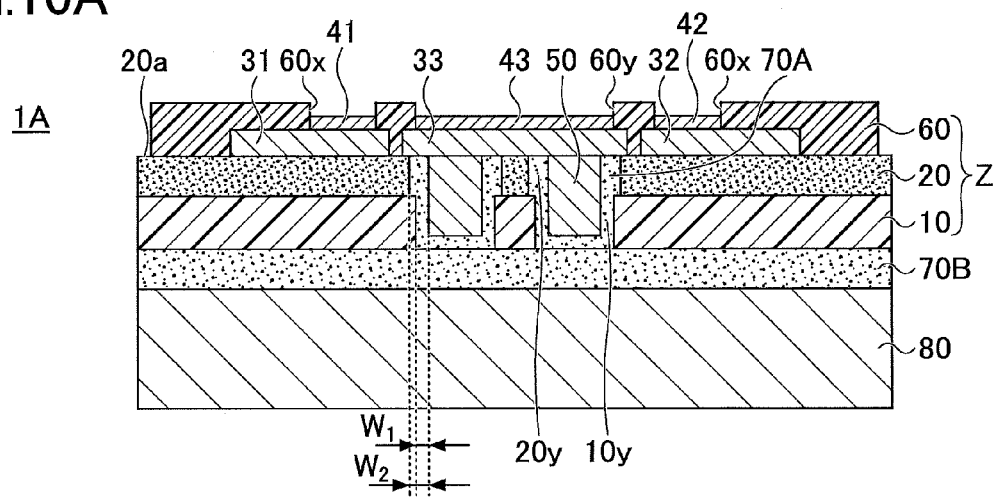
FIGS. 10A and 10B are diagrams depicting a wiring board according to a first variation of the first embodiment.
Figure 10B:
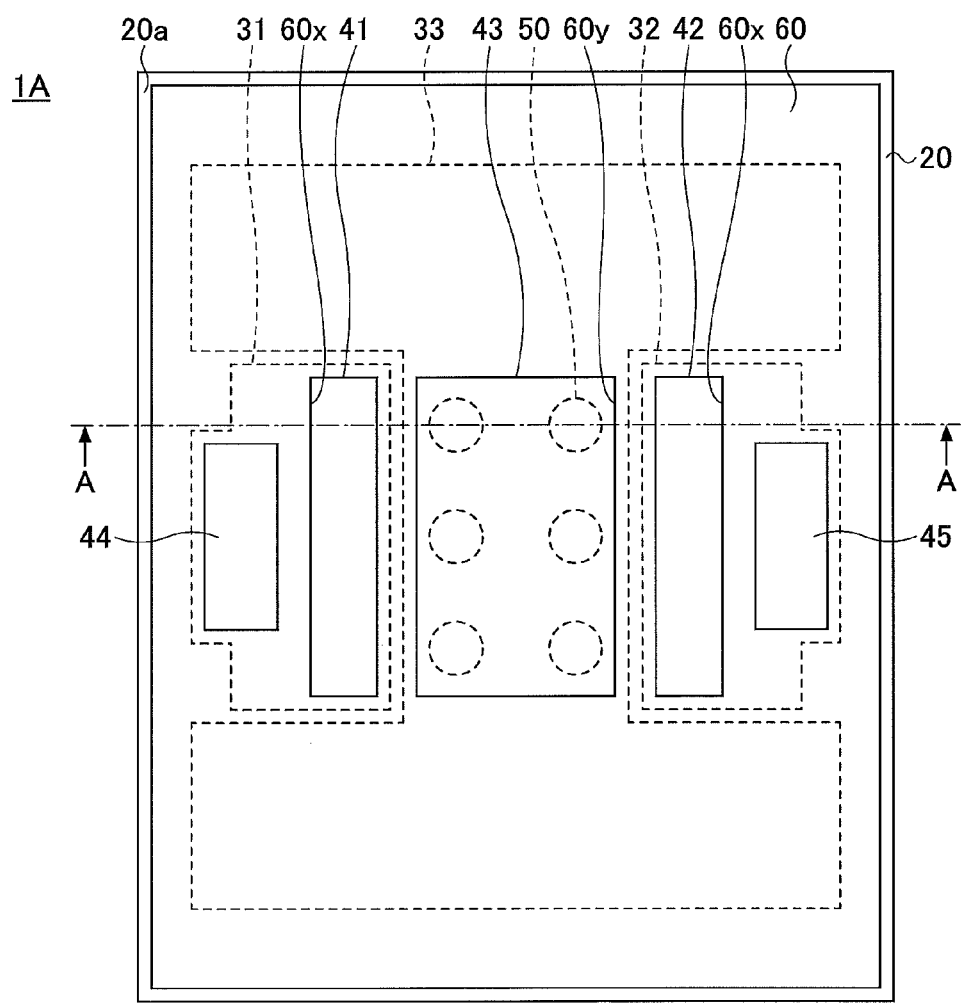

FIGS. 10A and 10B are diagrams illustrating a wiring board according to the first variation of the first embodiment. FIG. 10B is a plan view of the wiring board, and FIG. 10A is a cross-sectional view of the wiring board taken along a plane including a line A-A of FIG. 10B.

According to a wiring board 1A of the first variation, the first openings 10y and the second openings 20y are filled with an adhesive layer 70A. The wiring part Z having the first openings 10y and the second openings 20y filled with the adhesive layer 70A is fixed onto the heat spreader 80 through an adhesive layer 70B. The adhesive layer 70A is a typical example of a third adhesive layer according to an aspect of the present invention. The adhesive layer 70B is a typical example of a fourth adhesive layer according to an aspect of the present invention.

Figure 11A:
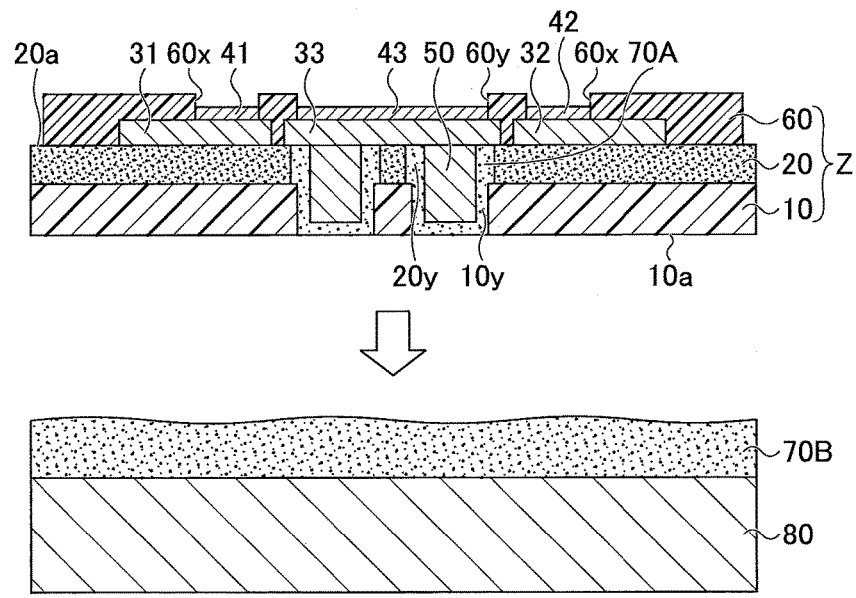
FIGS. 11A and 11B are diagrams depicting a method of manufacturing a wiring board according to the first variation of the first embodiment.

The wiring board 1A may be formed by executing the process of FIGS. 2A-2C and FIGS. 3A-6B and thereafter filling the first openings 10y and the second openings 20y with the adhesive layer 70A and hardening the adhesive layer 70A as depicted in FIG. 11A. At this point, part of the adhesive agent 70A may protrude from or overflow onto the lower surface 10b of the substrate 10. Next, the adhesive layer 70B is formed on the heat spreader 80, and the wiring part Z having the first openings 10y and the second openings 20y filled with the adhesive layer 70A is placed on the heat spreader 80 through an adhesive layer 70B. For example, a thermosetting epoxy resin in liquid or paste form containing a filler such as alumina may be used as the adhesive layers 70A and 70B. The material of the adhesive layer 70A and the material of the adhesive layer 70B do not have to be the same, and, for example, an adhesive having a higher filling characteristic may be selected for the adhesive layer 70A than for the adhesive layer 70B.

Figure 11B:
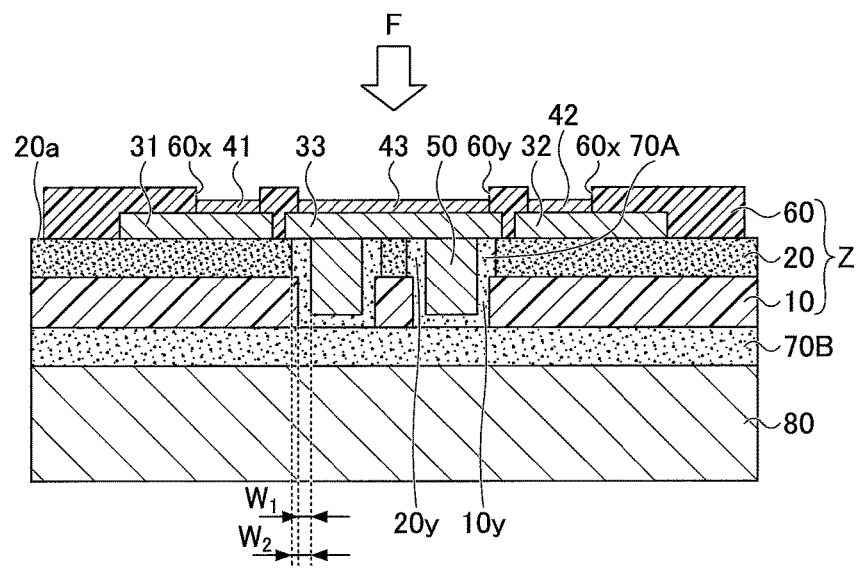

Next, in the process depicted in FIG. 11B, while pressing the single piece of the wiring part Z in the direction of arrow F (toward the heat spreader 80), the adhesive layer 70B is heated to a predetermined temperature to be hardened. By the above-described process, multiple wiring boards 1A (see FIGS. 10A and 10B) are completed.

By thus separately providing the adhesive layer 70A that fills in the first openings 10y and the second openings 20y and the adhesive layer 70B that fixes the wiring part Z onto the heat spreader 80, it is possible to individually select adhesive materials suitable for the adhesive layer 70A and the adhesive layer 70B, so that it is possible to increase the flexibility of design.

Second Variation of First Embodiment

A wiring board according to a second variation of the first embodiment is different from the wiring board 1 of the first embodiment in the region for forming vias. In the second variation of the first embodiment, the same components as those of the above-described embodiment are referred to using the same reference numeral, and a description thereof is omitted.

Figure 12A:
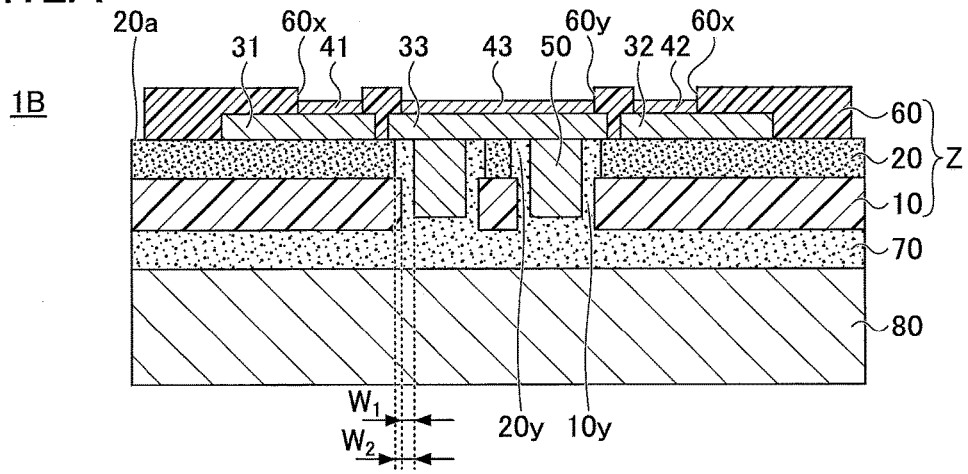
FIGS. 12A and 12B are diagrams depicting a wiring board according to a second variation of the first embodiment.
Figure 12B:
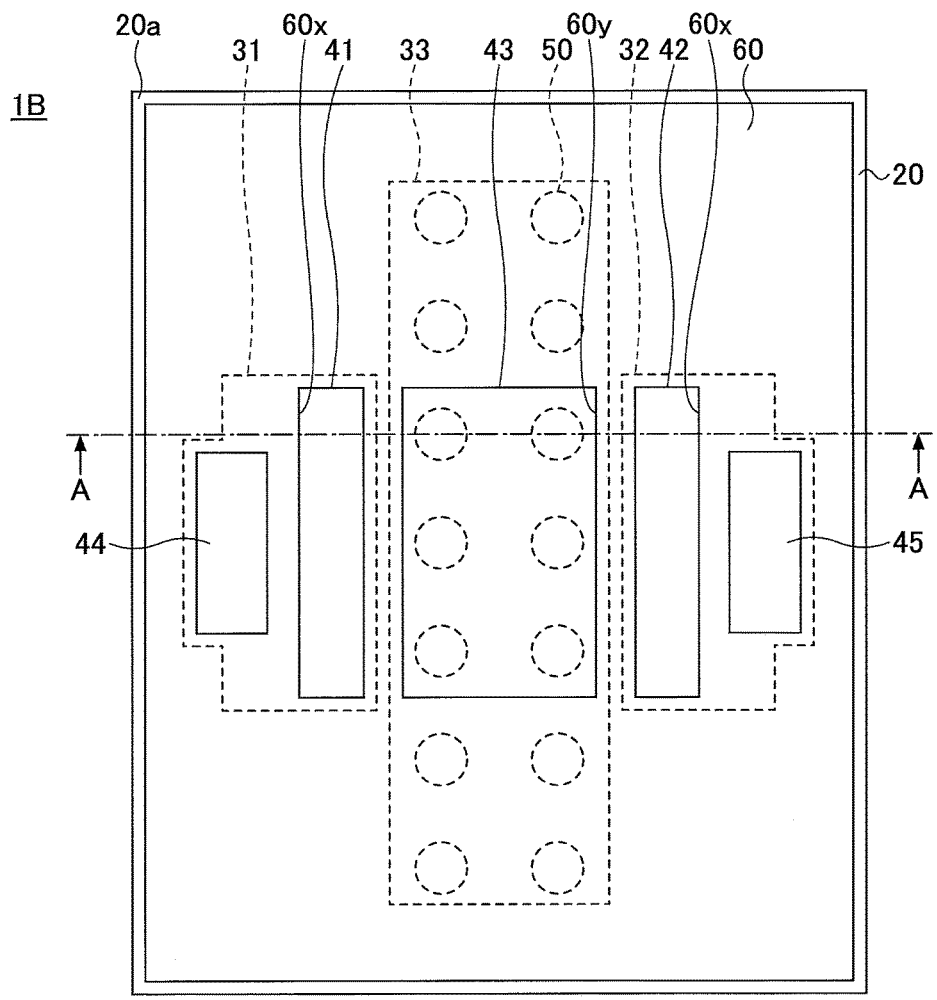

FIGS. 12A and 12B are diagrams illustrating a wiring board according to the second variation of the first embodiment. FIG. 12B is a plan view of the wiring board, and FIG. 12A is a cross-sectional view of the wiring board taken along a plane including a line A-A of FIG. 12B.

According to the wiring board 1 (see FIGS. 1A and 1B), the vias 50 are provided immediately under a region of the wiring pattern 33 exposed from the opening 60y of the insulating layer 60 (a region for forming the plating film 43). According to a wiring board 1B of the second variation, however, unlike the wiring board 1, the vias 50 are provided not only immediately under a region of the wiring pattern 33 exposed from the opening 60y of the insulating layer 60 (a region for forming the plating film 43) but also under a region of the wiring pattern 33 covered with the insulating layer 60. That is, the vias 50 are provided for the entire formation region of the wiring pattern 33. For example, the vias 50 may also be provided as depicted in FIG. 14B.

By thus providing the vias 50 for the entire wiring pattern 33, it is possible to further increase the heat dissipation efficiency.

A description or depiction of the vias 50 may be omitted for convenience of description, but the vias 50 are adaptable to any variation of this embodiment.

Third Variation of First Embodiment

A wiring board according to a third variation of the first embodiment is different from the wiring board 1 of the first embodiment in the planar shape of a wiring pattern under which vias are formed. In the third variation of the first embodiment, the same components as those of the above-described embodiment are referred to using the same reference numeral, and a description thereof is omitted.

Figure 13A:
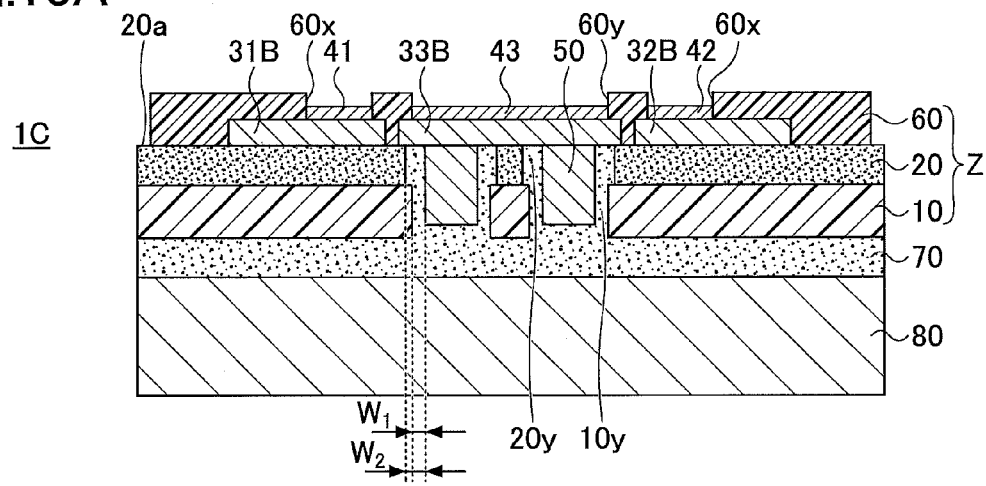
FIGS. 13A and 13B are diagrams depicting a wiring board according to a third variation of the first embodiment.
Figure 13B:
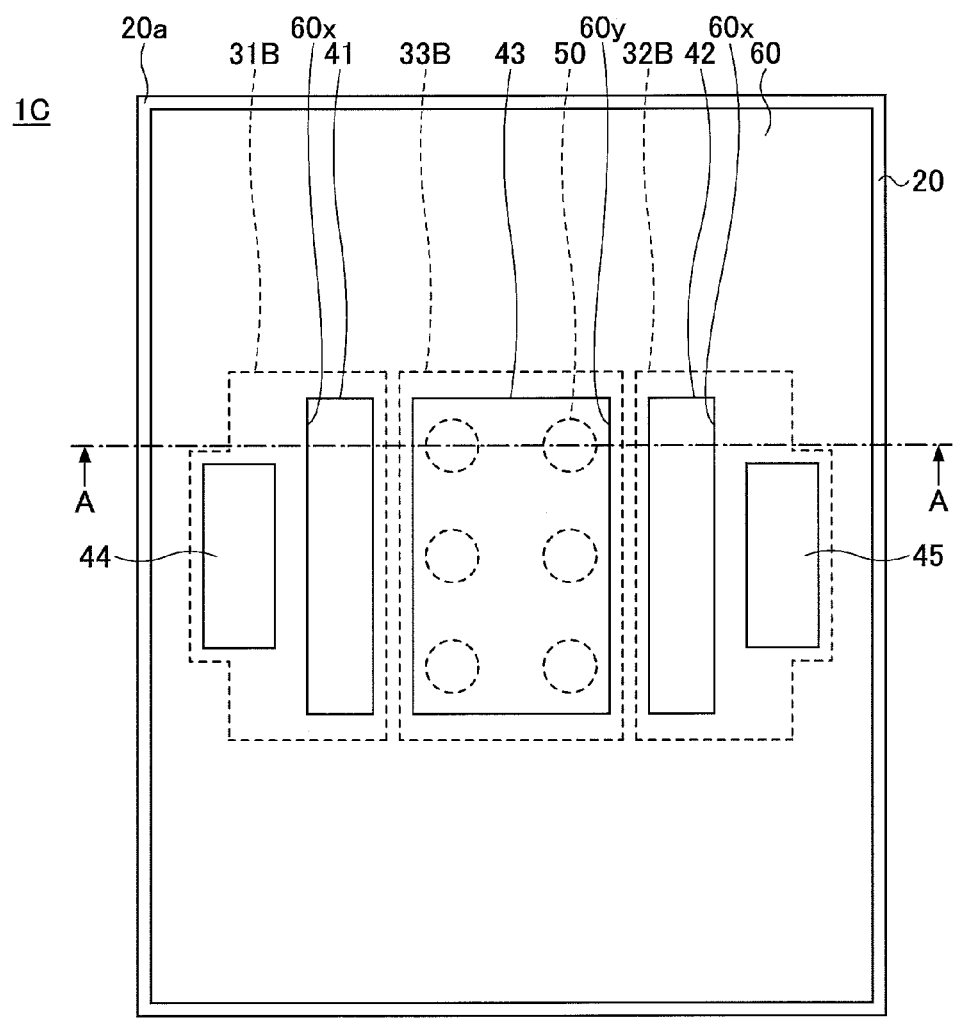

FIGS. 13A and 13B are diagrams illustrating a wiring board according to the third variation of the first embodiment. FIG. 13B is a plan view of the wiring board, and FIG. 13A is a cross-sectional view of the wiring board taken along a plane including a line A-A of FIG. 13B.

Referring to FIGS. 13A and 13B, a wiring board 1C of the third variation is different from the wiring board 1 (see FIGS. 1A and 1B) in that the wiring patterns 31 and 32 are replaced with wiring patterns 31B and 32B for electrical connection and the wiring pattern 33 is replaced with a wiring pattern 33B for thermal diffusion. The wiring patterns 31B-33B are provided in a smaller region on the adhesive layer 20 than the wiring patterns 31-33. That is, the wiring patterns 31B-33B are provided only in the vicinity of a region where the plating films 41-43 are formed (a region for mounting a semiconductor device).

The wiring patterns 31B-33B may be thus provided only in the vicinity of a region where the plating films 41-43 are formed (a region for mounting a semiconductor device). While heat dissipation is decreased by reducing the size of the planar shape of the wiring pattern 33B, the area of a wiring pattern for thermal diffusion may be suitably determined in view of a requirement for heat dissipation.

[b] Second Embodiment

A second embodiment is directed to a semiconductor package in which a semiconductor device (a light-emitting element) is mounted on the wiring board 1 according to the first embodiment. In the second embodiment, the same components as those of the above-described embodiment are referred to using the same reference numeral, and a description thereof is omitted.

Figure 14A:
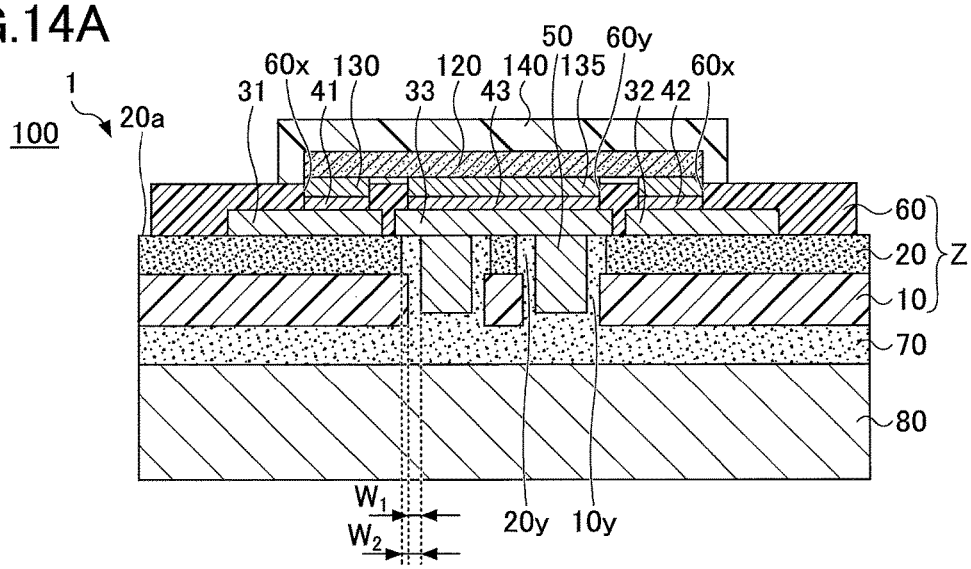
FIGS. 14A and 14B are diagrams depicting a semiconductor package according to a second embodiment.
Figure 14B:
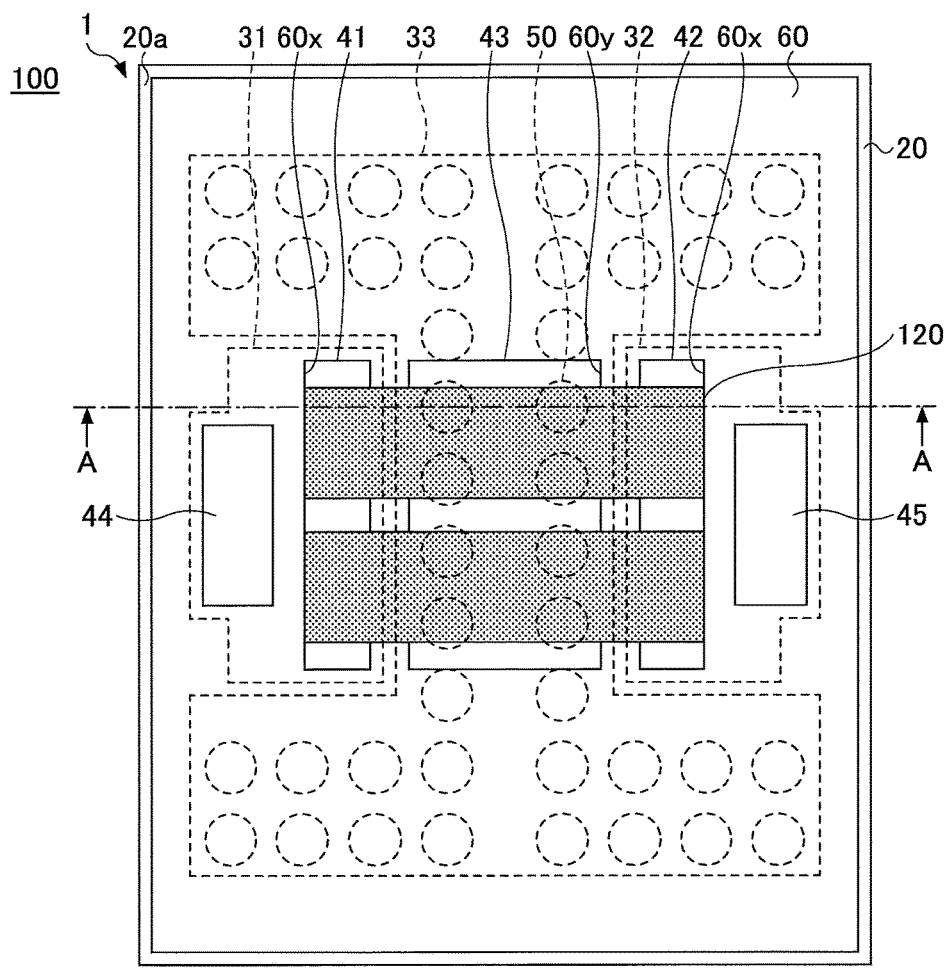

FIGS. 14A and 14B are diagrams illustrating a semiconductor package according to the second embodiment. FIG. 14B is a plan view of the semiconductor package, and FIG. 14A is a cross-sectional view of the semiconductor package taken along a plane including a line A-A of FIG. 14B. For an easier understanding of the positional relationship between semiconductor devices 120 and the vias 50, the semiconductor devices 120 are indicated by a dotted pattern and a depiction of members other than the semiconductor devices 120 on the wiring board 1 is omitted in FIG. 14B.

Referring to FIGS. 14A and 14B, a semiconductor package 100 includes the wiring board 1 (see FIGS. 1A and 1B), the semiconductor devices 120, solder (not depicted), and encapsulation resin 140. The semiconductor devices 120 are mounted on the wiring patterns 31 and 32 (surfaces of the plating films 41 and 42) of the wiring board 1 exposed in the openings 60x and on the wiring pattern 33 (a surface of the plating film 43) of the wiring board 1 exposed in the opening 60y. Specifically, each of the semiconductor devices 120 includes terminals 130 for electrical connection and a terminal 135 for thermal diffusion. The semiconductor devices 120 are mounted on the wiring board 1 in a face-down manner by flip-chip bonding with the terminals 130 soldered to the wiring patterns 31 and 32 (plating films 41 and 42) and the terminals 135 soldered to the wiring pattern 33 (plating film 43). The semiconductor devices 120 are encapsulated by the encapsulation resin 140. For example, a resin formed by mixing a fluorescent substance into an insulating resin such as a silicone may be used as the encapsulation resin 140. While the two semiconductor devices 120 are mounted side by side on the wiring board 1 in the case depicted in FIGS. 14A and 14B, a desired number of semiconductor devices 120 may be mounted on the wiring board 1.

The electrical connection terminals 130 of each of the semiconductor devices 120 are an anode terminal and a cathode terminal, which are, for example, formed on a lower surface (a surface facing toward the wiring board 1) of the semiconductor device 120 at first and second opposed ends, respectively, of the lower surface. The semiconductor devices 120 may be, but are not limited to, light-emitting diode (LED)s that are light-emitting elements. The semiconductor devices 120 may also be, for example, surface-emitting lasers. The following description is given based on the assumption that the semiconductor devices 120 are LEDs. Furthermore, in the following description, the semiconductor devices 120 may be collectively referred to as "semiconductor device 120" for convenience of description.

One of the electrical connection terminals 130 of the semiconductor device 120 is soldered to, for example, the plating film 41 of the wiring board 1. The other of the electrical connection terminals 130 of the semiconductor device 120 is soldered to, for example, the plating film 42 of the wiring board 1. Furthermore, the thermal diffusion terminal 135 is provided in the center of the lower surface of the semiconductor device 120. The thermal diffusion terminal 135 is soldered to the plating film 43 of the wiring board 1. According to the wiring board 1, the formation region of the wiring pattern 33 is greater than the formation region of the thermal diffusion terminal 135 of the semiconductor device 120 to be mounted as described above in the first embodiment. Therefore, it is possible to dissipate the heat released from the semiconductor device 120 by efficiently diffuse the heat laterally in the wiring pattern 33.

The semiconductor device 120 emits light when the plating films 44 and 45 of the wiring board 1 are connected to, for example, a power supply or a driver circuit provided outside the semiconductor package 100, so as to provide a predetermined potential difference between the electrical connection terminals 130 of the semiconductor device 120. The semiconductor device 120 releases heat when emitting light. The heat released from the semiconductor device 120 is transmitted to the vias 50 through the plating film 43 and the wiring pattern 33, and is further transmitted to the heat spreader 80 through the adhesive layer 70 to be dissipated from the heat spreader 80. Because the vias 50 are provided below the thermal diffusion terminal 135 of the semiconductor device 120, it is possible to efficiently transmit the heat released from the semiconductor device 120 to the heat spreader 80.

First Variation of Second Embodiment

A first variation of the second embodiment is directed to another semiconductor package in which a semiconductor device (a light-emitting element) is mounted on the wiring board 1 according to the first embodiment. In the first variation of the second embodiment, the same components as those of the above-described embodiments are referred to using the same reference numeral, and a description thereof is omitted.

Figure 15A:
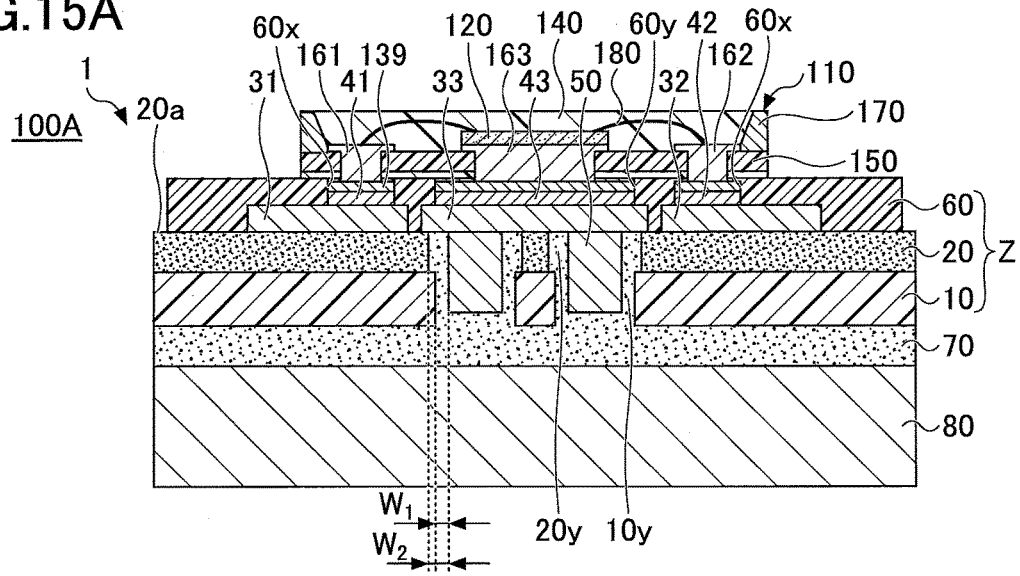
FIGS. 15A and 15B are diagrams depicting a semiconductor package according to a first variation of the second embodiment.
Figure 15B:
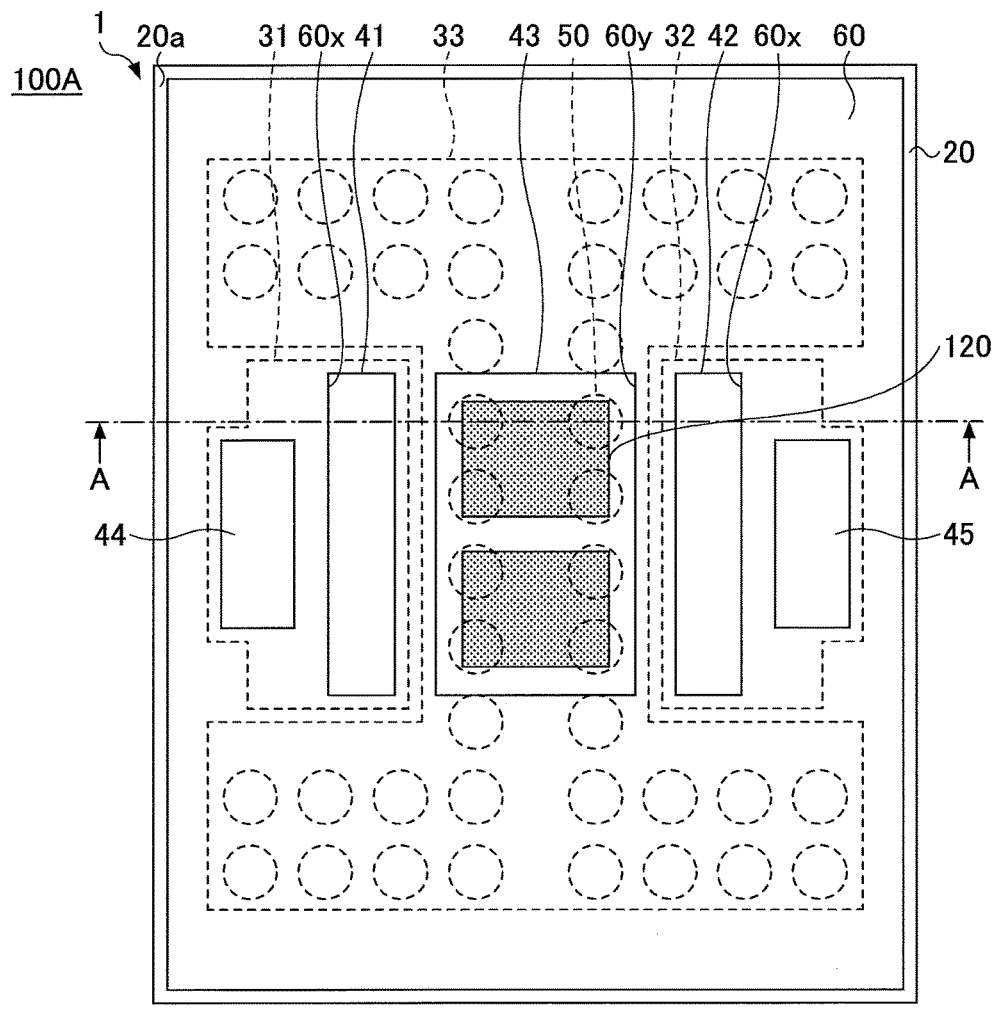

FIGS. 15A and 15B are diagrams illustrating a semiconductor package according to the first variation of the second embodiment. FIG. 15B is a plan view of the semiconductor package, and FIG. 15A is a cross-sectional view of the semiconductor package taken along a plane including a line A-A of FIG. 15B. For an easier understanding of the positional relationship between semiconductor devices 120 and the vias 50, the semiconductor devices 120 are indicated by a dotted pattern and a depiction of members other than the semiconductor devices 120 on the wiring board 1 is omitted in FIG. 15B.

Referring to FIGS. 15A and 15B, a semiconductor package 100A includes the wiring board 1 (see FIGS. 1A and 1b) and electronic components 110. The two electronic components 110 are mounted on the wiring patterns 31 and 32 (surfaces of the plating films 41 and 42) of the wiring board 1 exposed in the openings 60x and on the wiring pattern 33 (a surface of the plating film 43) of the wiring board 1 exposed in the opening 60y. While the two electronic components 110 are mounted side by side on the wiring board 1 in the case depicted in FIGS. 15A and 15B, a desired number of electronic components 1 may be mounted on the wiring board 1. In the following description, the electronic components 110 may be collectively referred to as "electronic component 110" for convenience of description.

The electronic component 110 includes a substrate 150 in which wiring patterns 161-163 are formed. The wiring patterns 161 and 162 are electrical connection terminals electrically connected to the semiconductor device 120. Furthermore, the wiring pattern 163 is a heat dissipation terminal that is not electrically connected to the semiconductor device 120. The wiring pattern 163 includes a part for mounting a semiconductor device, and has a heat dissipation function. The semiconductor device 120, which is an LED, is mounted on an upper surface of the wiring pattern 163 in a face-up manner. Furthermore, an upper surface of the wiring pattern 161 and an upper surface of the wiring pattern 162 are connected to the anode terminal and the cathode terminal, respectively, of the semiconductor device 120 by bonding wires 180. A reflector 170 that reflects light emitted by the semiconductor device 120 is mounted on a peripheral edge part of an upper surface of the substrate 150. Furthermore, the encapsulation resin 140 that encapsulates the semiconductor device 120 is provided inside the reflector 170.

A lower surface of the wiring pattern 161 and a lower surface of the wiring pattern 162 are exposed from a lower surface of the substrate 150 to be connected to the wiring pattern 31 (plating film 41) and the wiring pattern 32 (plating film 42), respectively, of the wiring board 1 through solder 139. A lower surface of the wiring pattern 163 is exposed from the lower surface of the substrate 150 to be connected to the wiring pattern 33 (plating film 43) of the wiring board 1 through the solder 139. According to the wiring board 1, the formation region of the wiring pattern 33 is greater than the formation region of the wiring pattern 163 of the electronic component 110 to be mounted as described above in the first embodiment. Therefore, it is possible to dissipate the heat released from the semiconductor device 120 by efficiently diffusing the heat laterally in the wiring pattern 33.

The semiconductor device 120 emits light when the plating film 44 and 45 of the wiring board 1 are connected to, for example, a power supply or a driver circuit provided outside the semiconductor package 100A, so as to provide a predetermined potential difference between the anode terminal and the cathode terminal of the semiconductor device 120. The semiconductor device 120 releases heat when emitting light. The heat released from the semiconductor device 120 is transmitted to the vias 50 through the heat dissipation wiring pattern 163, the plating film 43, and the wiring pattern 33, and is further transmitted to the heat spreader 80 through the adhesive layer 70 to be dissipated from the heat spreader 80. Because the vias 50 are provided below the heat dissipation wiring pattern 163 of the electronic component 110, it is possible to efficiently transmit the heat released from the semiconductor device 120 to the heat spreader 80.

Second Variation of Second Embodiment

A second variation of the second embodiment is directed to yet another semiconductor package in which a semiconductor device (a light-emitting element) is mounted on the wiring board 1 according to the first embodiment. In the second variation of the second embodiment, the same components as those of the above-described embodiments are referred to using the same reference numeral, and a description thereof is omitted.

Figure 16A:
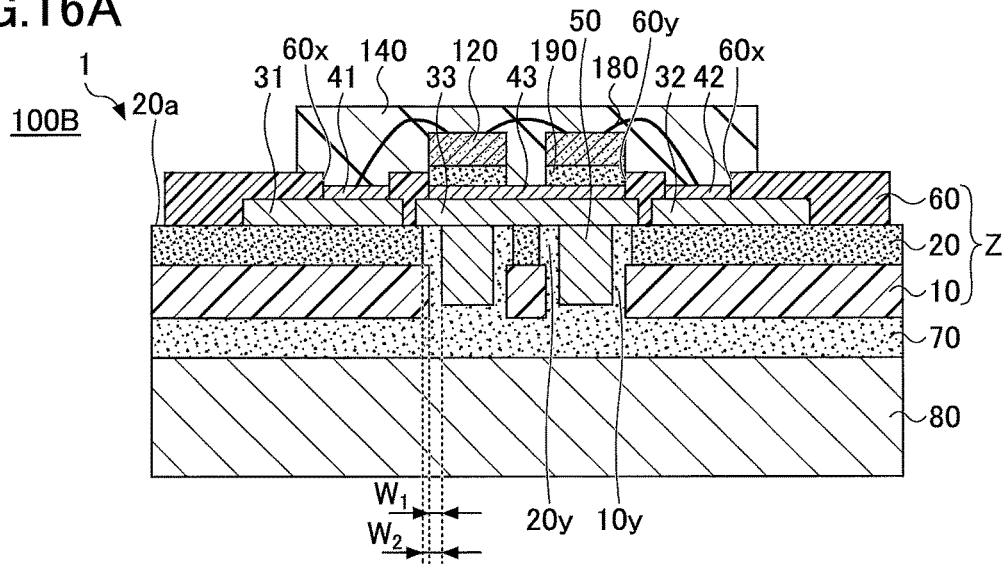
FIGS. 16A and 16B are diagrams depicting a semiconductor package according to a second variation of the second embodiment.
Figure 16B:
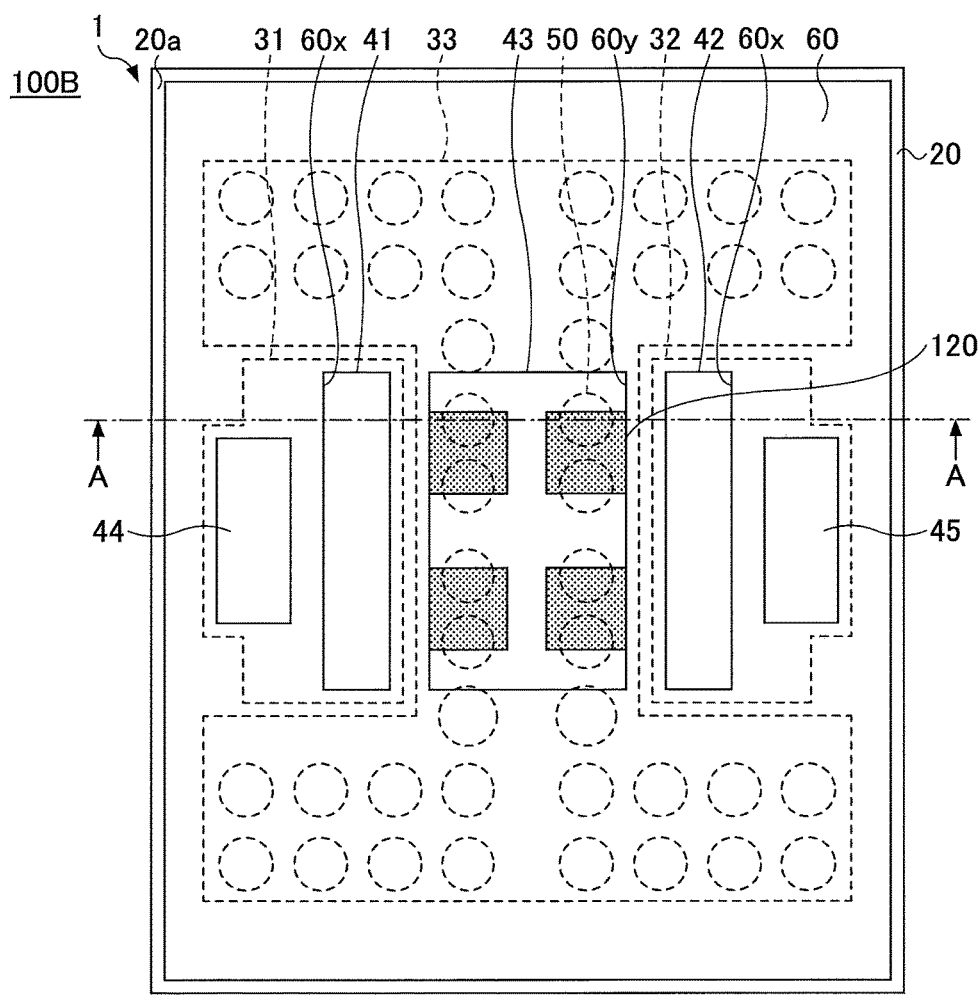

FIGS. 16A and 16B are diagrams illustrating a semiconductor package according to the second variation of the second embodiment. FIG. 16B is a plan view of the semiconductor package, and FIG. 16A is a cross-sectional view of the semiconductor package taken along a plane including a line A-A of FIG. 16B. For an easier understanding of the positional relationship between semiconductor devices 120 and the vias 50, the semiconductor devices 120 are indicated by a dotted pattern and a depiction of members other than the semiconductor devices 120 on the wiring board 1 is omitted in FIG. 16B.

Referring to FIGS. 16A and 16B, according to a semiconductor package 100B, the semiconductor device 120 is mounted on the wiring pattern 33 (a surface of the plating film 43) of the wiring board 1 exposed in the opening 60y. Specifically, the semiconductor devices 120 are mounted on the plating film 43 of the wiring board 1 in a face-up manner through a die attach adhesive layer 190. The semiconductor devices 120 are encapsulated by the encapsulation resin 140. While the four semiconductor devices 120 are mounted on the wiring board 1 in the case depicted in FIGS. 16A and 16B, a desired number of semiconductor devices 120 may be mounted on the wiring board 1.

The semiconductor devices 120 are connected in series two by two in the widthwise direction of the plating film 43 (a direction in which the plating films 41-45 are arranged) by the bonding wires 180. For example, the anode terminal of one semiconductor device 120 and the cathode terminal of the other semiconductor device 120 of the two semiconductor devices 120 arranged in the widthwise direction of the plating film 43 are connected by one of the bonding wires 180. Furthermore, the cathode terminal of the one semiconductor device 120 is connected to the plating film 41 by one of the bonding wires 180, and the anode terminal of the other semiconductor device 120 is connected to the plating film 42 by one of the bonding wires 180. Furthermore, two pairs of the semiconductor devices 120 connected in series in the widthwise direction of the plating film 43 are arranged in the lengthwise direction of the plating film 43 and are connected in parallel.

According to the wiring board 1, the formation region of the wiring pattern 33 is greater than the planar shape of the semiconductor device 120 to be mounted. Therefore, it is possible to efficiently dissipate heat released from the semiconductor device 120.

The semiconductor device 120 emits light when the plating film 44 and 45 of the wiring board 1 are connected to, for example, a power supply or a driver circuit provided outside the semiconductor package 100B, so as to provide a predetermined potential difference between the anode terminal and the cathode terminal of the semiconductor device 120. The semiconductor device 120 releases heat when emitting light. The heat released from the semiconductor device 120 is transmitted to the vias 50 through the plating film 43 and the wiring pattern 33, and is further transmitted to the heat spreader 80 through the adhesive layer 70 to be dissipated from the heat spreader 80. Because the vias 50 are provided under the wiring pattern 33 on which the semiconductor device 120 is mounted, it is possible to efficiently transmit the heat released from the semiconductor device 120 to the heat spreader 80.

While semiconductor packages are described above with reference to FIGS. 14A-16B, preferable positional relationships between the shape of the semiconductor device 120 and the vias 50 in the wiring part Z are described below with reference to FIGS. 17A-17D.

FIGS. 17A-17D are diagrams for describing positional relationships between the shape of a semiconductor device and vias. As depicted in FIGS. 17A-17D, the vias 50 are preferably provided in the wiring part Z so that the shape of one or more, preferably, two or more, of the vias 50 is at least partly within the range of the shape of the semiconductor device 120 in a plan view.

Figure 17A:
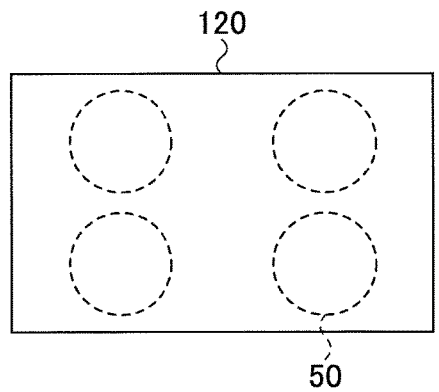
FIGS. 17A-17D are diagrams for describing positional relationships between the shape of a semiconductor device and vias.

For example, as depicted in FIG. 17A, two or more of the vias 50 may be positioned in their entirety within the range of the shape of the semiconductor device 120 in a plan view. The number of vias 50 positioned in their entirety within the range of the shape of the semiconductor device 120 in a plan view, which is four in the case depicted in FIG. 17A, may alternatively be two, three, or more than four.

Figure 17B:
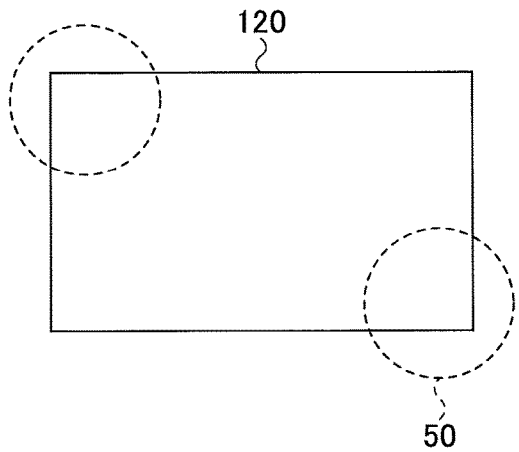
Figure 17C:
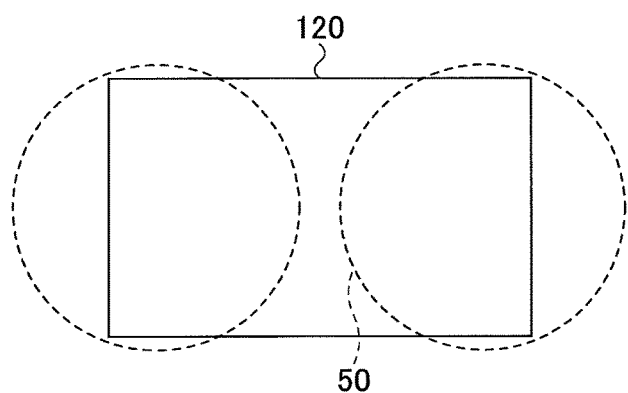

Furthermore, as depicted in FIGS. 17B and 17C, as long as the shape of each of two or more of the vias 50 is partly within the range of the shape of the semiconductor device 120 in a plan view, the shape of each of the two or more of the vias 50 may be partly outside the range of the shape of the semiconductor device 120 in a plan view. The two or more of the vias 50 may be diagonally placed or be opposed to each other relative to any one side of the shape of the semiconductor device 120 in a plan view.

Figure 17D:
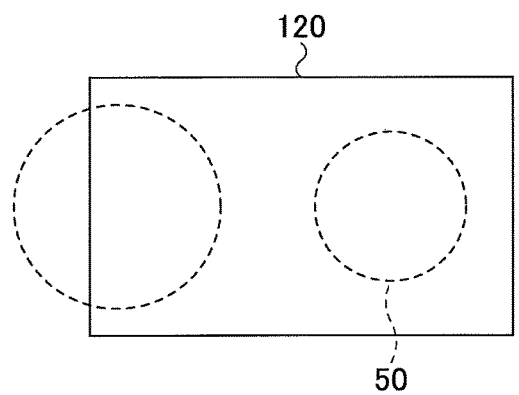

Furthermore, as depicted in FIG. 17D, as long as two or more of the vias 50 are partly or entirely positioned within the range of the shape of the semiconductor device 120 in a plan view, one of the two or more of the vias 50 may be positioned in its entirety and another of the two or more of the vias 50 may be partly positioned outside the range of the shape of the semiconductor device 120 in a plan view. Furthermore, the vias 50 may be either equal or different in planar shape.

By providing the vias 50 so that the shape of each of two or more of the vias 50 is at least partly within the range of the shape of the semiconductor device 120 in a plan view as depicted by way of example in FIGS. 17A-17D, it is possible to further increase heat dissipation.

For example, it is assumed that only a single via 50 is placed within the range of the shape of the semiconductor device 120 in a plan view. In this case, heat concentrates on the single via 50, so that the heat dissipation effect decreases. Therefore, by placing two or more of the vias 50 so that the shape of each of the two or more of the vias 50 is at least partly within the range of the shape of the semiconductor device 120 in a plan view as in this embodiment, it is possible to avoid the concentration of heat and accordingly to increase heat dissipation.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, in the case of mounting the semiconductor device 120 in a face-up manner through the die attach adhesive layer 190 without connecting a lower surface of the semiconductor device 120 and the plating film 43 by solder or the like as depicted in FIGS. 16A and 16B, the wiring pattern 33 may be covered in its entirety with the insulating layer 60 without providing the plating film 43. That is, there is no need to provide the opening 60y that exposes the wiring pattern 33 in the insulating layer 60. In this case, the semiconductor device 120 is mounted through the die attach adhesive layer 190 on the insulating layer 60 that covers the wiring pattern 33. That is, the insulating layer 60 is present immediately below the semiconductor device 120.

Furthermore, semiconductor devices to be mounted on the wiring board 1 are not limited to light-emitting elements, and may be heat-releasing semiconductor devices that release heat because of an operating-time electric current. Because the wiring board 1 has a good heat dissipation characteristic, it is possible to increase the dissipation of heat released from a heat-releasing semiconductor device mounted on the wiring board 1 and to reduce problems caused by heat. Heat-releasing semiconductor devices may also be mounted on the wiring boards 1A, 1B and 1C. Examples of semiconductor devices other than light-emitting elements include power semiconductor devices. Examples of power semiconductor devices include insulated-gate bipolar transistor (IGBT)s and metal-oxide-semiconductor field-effect transistor (MOSFET)s.

The number of semiconductor devices to be mounted on the wiring board 1 may be determined as desired.

Furthermore, as described above, in the case of mounting a light-emitting element on the wiring board 1 as a semiconductor device, it is preferable to use a reflective film using white ink or the like for the insulating layer 60 in order to increase reflectance with respect to the light emitted from the light-emitting element and the rate of dissipating heat released from the light-emitting element. In the case of mounting a heat-releasing semiconductor device other than the light-emitting element, however, the insulating layer 60 does not have to be a reflective film and may have a function different from that of the reflective film. For example, the insulating layer 60 may be a solder resist layer or any of various insulating layers formed of an epoxy resin or a polyimide resin. Alternatively, the insulating layer 60 may be omitted.

Various aspects of the subject-matter described herein may be set out non-exhaustively in the following numbered clauses:

1. A method of manufacturing a wiring board, including:

forming a thermal diffusion metal pattern on a first adhesive layer on a first surface of a substrate, the thermal diffusion metal pattern being not to be connected to a semiconductor device to be mounted on the wiring board;

forming a plurality of vias so that the vias vertically extend from the thermal diffusion metal pattern into the substrate through the first adhesive layer;

forming an opening around each of the vias in the substrate and the first adhesive layer by etching the substrate and the first adhesive layer, so that the opening exposes the thermal diffusion metal layer; and bonding a second surface of the substrate opposite to the first surface to a heat spreader through a second adhesive layer, so that the second adhesive layer fills in the opening formed around each of the vias,
wherein said forming the opening forms a first opening around each of the vias in the substrate and a second opening around each of the vias in the first adhesive layer, so that the second opening communicates with the first opening and the second opening has a lateral size greater than a lateral size of the first opening.

2. The method of clause 1, wherein the second adhesive layer is in contact with a side surface of the substrate exposed in the first opening around each of the vias and the first surface of the substrate exposed in the second opening around each of the vias.

3. The method of clause 1, wherein forming the plurality of vias forms the vias so that an end of each of the vias facing away from the thermal diffusion metal pattern is at a depressed position relative to the second surface of the substrate.

What is claimed is:

1. A wiring board, comprising:
   a substrate having first and second opposite surfaces;
   a first adhesive layer on the first surface of the substrate;
   a thermal diffusion metal pattern not to be electrically connected to a semiconductor device to be mounted on the wiring board, the thermal diffusion metal pattern being on the first adhesive layer;
   a plurality of vias vertically extending from the thermal diffusion metal pattern into the substrate through the first adhesive layer with a gap around each of the vias in the substrate and the first adhesive layer; and
   a second adhesive layer on the second surface of the substrate, the second adhesive layer filling in the gap around each of the vias within the substrate and the first adhesive layer,
   wherein the gap around each of the vias includes a first gap around each of the vias in the substrate and a second gap around each of the vias in the first adhesive layer, and
   wherein the second gap has a lateral size greater than a lateral size of the first gap.

2. The wiring board as claimed in claim 1, wherein a surface of the thermal diffusion metal pattern that faces away from the semiconductor device to be mounted on the wiring board is exposed to the gap around each of the vias and in contact with the second adhesive layer in the gap.

3. The wiring board as claimed in claim 1, wherein each of the first and second gaps has an annular shape in a plan view.

4. The wiring board as claimed in claim 1, wherein the second adhesive layer is in contact with a side surface of the substrate exposed to the first gap around each of the vias and the first surface of the substrate exposed to the second gap around each of the vias.

5. The wiring board as claimed in claim 1, further comprising:
   a heat spreader fixed to the second surface of the substrate through the second adhesive layer.

6. The wiring board as claimed in claim 1, wherein the second adhesive layer is in contact with a peripheral surface of each of the vias.

7. The wiring board as claimed in claim 1, further comprising:
   an electrical connection metal pattern to be electrically connected to the semiconductor device, the electrical connection metal pattern being provided in a same plane as the thermal diffusion metal pattern on the first adhesive layer; and
   an insulating layer on the first adhesive layer, the insulating layer including a first opening that exposes the thermal diffusion metal pattern and a second opening that exposes the electrical connection metal pattern,
   wherein, in a plan view, the thermal diffusion metal pattern extends outside the first opening in the insulating layer and is greater than a region in which the electrical connection metal pattern is formed.

8. The wiring board as claimed in claim 7, wherein the insulating layer is a reflective film configured to reflect light emitted from the semiconductor device.

9. The wiring board as claimed in claim 7, wherein
   the electrical connection metal pattern is formed only on a planar surface, and
   the vias are absent in a region in the substrate and the second adhesive layer coinciding with the electrical connection metal pattern in the plan view.

10. The wiring board as claimed in claim 1, wherein, in a plan view, a shape of at least one of the vias is at least partly within a range of a shape of the semiconductor device.

11. The wiring board as claimed in claim 1, wherein the substrate is a polyimide resin.

12. The wiring board as claimed in claim 1, wherein the second adhesive layer includes a filler.

13. The wiring board as claimed in claim 1, wherein an end of each of the vias facing away from the thermal diffusion metal pattern is at a depressed position relative to the second surface of the substrate.

14. A semiconductor package, comprising:
    the wiring board as claimed in claim 1; and
    the semiconductor device mounted on the thermal diffusion metal pattern.

15. A wiring board, comprising:
    a substrate;
    a first adhesive layer on a first surface of the substrate that faces toward a semiconductor device to be mounted on the wiring board;
    a thermal diffusion metal pattern not to be electrically connected to the semiconductor device to be mounted on the wiring board, the thermal diffusion metal pattern being on the first adhesive layer;
    a second adhesive layer on a second surface of the substrate opposite to the first surface; and
    a plurality of vias vertically extending from the thermal diffusion metal pattern, the vias being buried in the second adhesive layer within the substrate and the first adhesive layer.

16. The wiring board as claimed in claim 15, wherein a distance between a peripheral surface of each of the vias and a surface of the first adhesive layer facing the peripheral surface across the second adhesive layer is greater than a distance between the peripheral surface and a side surface of the substrate facing the peripheral surface across the second adhesive layer.

17. The wiring board as claimed in claim 15, wherein there is a step between a surface of the first adhesive layer facing a peripheral surface of each of the vias across the second adhesive layer and a side surface of the substrate facing the peripheral surface across the second adhesive layer.

18. A semiconductor package, comprising:
    the wiring board as claimed in claim 15; and
    the semiconductor device mounted on the thermal diffusion metal pattern.

* * * * *